United States Patent
Tauchi et al.

(10) Patent No.: US 7,419,711 B2
(45) Date of Patent: *Sep. 2, 2008

(54) AG BASE ALLOY THIN FILM AND SPUTTERING TARGET FOR FORMING AG BASE ALLOY THIN FILM

(75) Inventors: Yuuki Tauchi, Kobe (JP); Katsutoshi Takagi, Kobe (JP); Junichi Nakai, Kobe (JP); Toshiki Sato, Kobe (JP)

(73) Assignee: Kobe Steel, Ltd., Kobe-shi (JP)

( * ) Notice: Subject to any disclaimer, the term of this patent is extended or adjusted under 35 U.S.C. 154(b) by 164 days.

This patent is subject to a terminal disclaimer.

(21) Appl. No.: 11/313,815

(22) Filed: Dec. 22, 2005

(65) Prior Publication Data

US 2006/0104853 A1 May 18, 2006

Related U.S. Application Data

(63) Continuation of application No. 10/633,550, filed on Aug. 5, 2003.

(30) Foreign Application Priority Data

| Aug. 8, 2002 | (JP) | 2002-231596 |
| Aug. 9, 2002 | (JP) | 2002-233283 |
| Aug. 20, 2002 | (JP) | 2002-239972 |
| Dec. 12, 2002 | (JP) | 2002-361117 |
| Jan. 9, 2003 | (JP) | 2003-003643 |
| Jan. 10, 2003 | (JP) | 2003-004586 |
| Apr. 25, 2003 | (JP) | 2003-122314 |

(51) Int. Cl.
B32B 3/02 (2006.01)

(52) U.S. Cl. .......... 428/64.1; 428/64.4; 430/270.12

(58) Field of Classification Search ........ 428/64.1, 428/64.4; 430/270.12
See application file for complete search history.

(56) References Cited

U.S. PATENT DOCUMENTS

| 4,743,526 | A |   | 5/1988  | Ando et al. |
| 4,998,239 | A | * | 3/1991  | Strandjord et al. ....... 369/275.1 |
| 5,948,497 | A |   | 9/1999  | Hatwar et al. |
| 5,989,669 | A | * | 11/1999 | Usami ....................... 428/64.1 |

(Continued)

FOREIGN PATENT DOCUMENTS

CN          1248044          9/1998

(Continued)

OTHER PUBLICATIONS

U.S. Appl. No. 11/353,168, filed Feb. 14, 2006, Tauchi et al.

(Continued)

*Primary Examiner*—Elizabeth Mulvaney
(74) *Attorney, Agent, or Firm*—Oblon, Spivak, McClelland, Maier & Neustadt, P.C.

(57) ABSTRACT

The present invention relates to an Ag alloy film. Particularly, it is preferably used as a reflective film or semi-transmissive reflective film for an optical information recording medium having high thermal conductivity/high reflectance/high durability in the field of optical information recording media, an electromagnetic-shielding film excellent in Ag aggregation resistance, and an optical reflective film on the back of a reflection type liquid crystal display device, or the like. The Ag alloy film of the present invention comprises an Ag base alloy containing Bi and/or Sb in a total amount of 0.005 to 10% (in terms of at %). Further, the present invention relates to a sputtering target used for the deposition of such an Ag alloy film.

61 Claims, 2 Drawing Sheets

U.S. PATENT DOCUMENTS

| | | | |
|---|---|---|---|
| 6,007,889 | A | 12/1999 | Nee |
| 6,280,811 | B1 | 8/2001 | Nee |
| 6,351,446 | B1 | 2/2002 | Weinzerl et al. |
| 6,451,402 | B1 | 9/2002 | Nee |
| 6,544,616 | B2 * | 4/2003 | Nee .................. 428/64.1 |
| 6,689,444 | B2 | 2/2004 | Nakai et al. |
| 6,790,503 | B2 | 9/2004 | Nee |
| 6,852,384 | B2 | 2/2005 | Nee |
| 7,022,384 | B2 | 4/2006 | Fujii et al. |
| 7,203,003 | B2 | 4/2007 | Nakai et al. |
| 2002/0012604 | A1 | 1/2002 | Aratani et al. |
| 2002/0034603 | A1 | 3/2002 | Nee |
| 2004/0028912 | A1 | 2/2004 | Tauchi et al. |
| 2004/0258872 | A1 | 12/2004 | Nee |
| 2005/0015362 | A1 | 1/2005 | Ostertag et al. |
| 2005/0018583 | A1 | 1/2005 | Worthington et al. |
| 2005/0238839 | A1 | 10/2005 | Takagi et al. |
| 2005/0287333 | A1 | 12/2005 | Takagi et al. |
| 2006/0013988 | A1 | 1/2006 | Tauchi et al. |
| 2006/0104853 | A1 | 5/2006 | Tauchi et al. |
| 2006/0234001 | A1 | 10/2006 | Tauchi et al. |

FOREIGN PATENT DOCUMENTS

| | | |
|---|---|---|
| EP | 0 594 516 | 4/1994 |
| EP | 1 152 405 | 11/2001 |
| JP | 52-013688 | 2/1977 |
| JP | 58-130237 | 8/1983 |
| JP | 04-28032 | 1/1992 |
| JP | 04-38737 | 2/1992 |
| JP | 04-252440 | 9/1992 |
| JP | 06-302027 | 10/1994 |
| JP | 07-134300 | 5/1995 |
| JP | 07-315874 | 12/1995 |
| JP | 08-293379 | 11/1996 |
| JP | 09-135096 | 5/1997 |
| JP | 09-230806 | 9/1997 |
| JP | 11-231122 | 8/1999 |
| JP | 2000-57627 | 2/2000 |
| JP | 2001-126315 | 5/2001 |
| JP | 2001-184725 | 7/2001 |
| JP | 2002-15464 | 1/2002 |
| JP | 2002-92959 | 3/2002 |
| JP | 2002-237097 | 8/2002 |
| JP | 2002-332568 | 11/2002 |
| KR | 8301156 | 6/1983 |
| WO | WO 02/07919 | 1/2002 |

OTHER PUBLICATIONS

U.S. Appl. No. 11/313,815, filed Dec. 22, 2005, Tauchi et al.
U.S. Appl. No. 11/375,036, filed Mar. 15, 2006, Tauchi et al.
U.S. Appl. No. 11/395,227, filed Apr. 3, 2006, Tauchi et al.
U.S. Appl. No. 11/401,853, filed Apr. 12, 2006, Tauchi et al.
U.S. Appl. No. 11/428,045, filed Jun. 30, 2006, Fujii et al.
U.S. Appl. No. 11/425,062, filed Jun. 19, 2006, Tauchi et al.
U.S. Appl. No. 11/425,068, filed Jun. 19, 2006, Nakai et al.
U.S. Appl. No. 11/612,791, filed Dec. 19, 2006, Nakano et al.
Applicant's Amendment filed on Jul. 31, 2006, in U.S. Appl. No. 10/633,550.
Office Action issued on Oct. 19, 2006, in U.S. Appl. No. 10/633,550.
Request for Continued Examination along with Amendment filed Jan. 29, 2007, in U.S. Appl. No. 10/633,550.
Office Action issued on Apr. 19, 2007, in U.S. Appl. No. 10/633,550.
Applicant's Amendment filed on May 18, 2007, in U.S. Appl. No. 10/633,550.
Office Action issued Aug. 7, 2007, in U.S. Appl. No. 10/633,550.
U.S. Appl. No. 12/100,823, filed Apr. 10, 2008, Tauchi et al.

* cited by examiner

AG BASE ALLOY THIN FILM AND SPUTTERING TARGET FOR FORMING AG BASE ALLOY THIN FILM

CONTINUATION DATA

This application is a Continuation of prior U.S. application Ser. No. 10/633,550, filed on Aug. 5, 2003, pending.

BACKGROUND OF THE INVENTION

1. Field of the Invention

The present invention relates to an Ag alloy film. More particularly, it relates to an Ag alloy film preferably used as a reflective film or a semi-transmissive reflective film for an optical information recording medium having high thermal conductivity/high reflectance/high durability in the field of optical information recording media, an electromagnetic-shielding film excellent in Ag aggregation resistance, or an optical reflective film on the back of a reflection type liquid crystal display device or the like. Further, the present invention relates to a sputtering target for use in deposition of such an Ag alloy film.

2. Description of the Related Art

For the reflective films or the semi-transmissive reflective films included in optical information recording media (optical disks), Au, Al, Ag, or alloys containing these as main components have been widely used from the viewpoints of thermal conductivity, reflectance, and durability.

The Ag-based reflective film containing Ag as a main component has the following features: it has high reflectance with respect to a violet laser for use in a next-generation optical disk, and high thermal conductivity required of a write-once/writable disk; and, in addition, the raw material cost thereof is lower as compared with an Au-based reflective film. Therefore, it is a promising material as a reflective film or a semi-transmissive reflective film. However, it is superior to an Al-based reflective film in terms of durability, but it does not have durability as high as that of the Au-based reflective film. In order to put it into actual use as a reflective film or a semi-transmissive reflective film of an optical disk, it is necessary to improve the durability without impairing the high reflectance and the high thermal conductivity inherently possessed by Ag.

As for the means for improving the durability of such an Ag-based reflective film, the following improvement measures have been reported. For example, the durability (chemical stability) is respectively improved by adding Au, Pd, Cu, Rh, Ru, Os, Ir, and Pt to Ag in U.S. Pat. No. 6,007,889, or by adding Pd and Cu to Ag in U.S. Pat. No. 5,948,497. Further, the present inventors also have proposed a method in which the durability (thermal stability in the inhibition of grain growth, or the like) is improved by adding rare earth metal elements to Ag in JP-A 15464/2002.

However, for high-speed recording DVDs or next-generation optical disks, the levels of characteristics required of the reflective film have been further raised. This results in demands for durability, thermal conductivity, and reflectance of higher levels than ever before.

Particularly, for the durability, there is a demand for high corrosion resistance against halogen elements including chlorine. This demand is particularly prominent for a write-once optical disk in which a halogen element-containing organic dye recording film, a protective film, an adhesive layer, and the like are directly stacked on a reflective film. Further, as distinct from a DVD, the next-generation optical disk is in an inverted stacked configuration obtained in the following manner. First, a reflective film is deposited on a transparent plastic substrate, and dielectric protective film/recording film/dielectric protective film/are stacked and deposited thereon. For this reason, the surface roughness of the reflective film must be extremely reduced in order to suppress the deterioration of the recording and reproduction characteristics. Further, the next-generation optical disk is required to be capable of keeping the stability of the surface roughness even when put under a thermal load.

Whereas, as for the thermal conductivity, the heat generated in the very small region of the recording film through laser light irradiation is required to be rapidly diffused. Thus, in order for the reflective film to also have the function as a thermal diffusion film, the film is required to have high thermal conductivity.

Further, as for the reflectance, the reflective film is required to have high reflectance also with respect to the violet laser for use in a high-speed DVD or a next-generation optical disk.

However, no Ag base alloy has been yet found which satisfies all these requirements. In order that the reflective film may ensure high reliability as being used for a high-speed DVD or a next-generation optical disk, there is a strong demand for an Ag base alloy which has all the required characteristics of high thermal conductivity, high reflectance, and high durability.

On the other hand, conventionally, an Ag film has found various uses because of its high visible light transmittance and excellent infrared shielding property. For example, an infrared-shielding Ag film transparent member obtained by forming Ag on a transparent substrate of glass or the like through sputtering or the like is used in order to improve the heating and cooling efficiency in a room. Further, since the Ag film is also excellent in radio wave shielding property, for example, in order to protect electronic equipments which may undergo mis-operation due to radio wave from an external radio wave, or in order to suppress the emission of the radio wave generated from electronic equipments, it is used in the following manner. An Ag film is applied as described above on the window pane of the laboratory in which the equipments are set; or an Ag film or an Ag film-applied substrate is mounted internally in or externally on each of the equipments.

However, the Ag film has low abrasion resistance, and further, it has insufficient durability against environment. Therefore, it will be deteriorated due to moisture or the like, and hence it is difficult to use for a long period. For this reason, a means of increasing the thickness of the Ag film has been adopted. However, a sufficient solution has not yet been made from the viewpoints of abrasion resistance and durability improvements. Eventually, the Ag film will be deteriorated with the passage of time, so that the pure Ag film lacks the practicality. Incidentally, through the increase in film thickness, the electromagnetic shielding characteristics (infrared shielding property and radio wave shielding property) are improved. However, the visible light transmittance is decreased, so that it becomes dark in the room.

Under such circumstances, as a technique for increasing the transmittance within a visible light region, and further, improving the abrasion resistance and the weather resistance of the Ag film, there is proposed a technique of coating the Ag film with a transparent dielectric film made of an oxide such as tin oxide, zinc oxide, or titanium oxide, or a nitride such as silicon nitride. Further, in order to improve the adhesion between the Ag film and the oxide or the nitride, there is also proposed a technique of inserting Cr or a Ni—Cr alloy layer between the Ag film and the oxide or the nitride.

In accordance with the technique, it is possible to reduce the optical reflectance of the Ag film. This produces the effects of allowing the reduction of the glaring feeling due to a reflected light from the Ag film, and providing a longer life period than that of the pure Ag film. However, even if Ag is coated with a transparent dielectric film, Ag aggregates from the defective portions such as pinholes and scratches of the transparent dielectric film itself as the starting points when exposed to air. As a result, the Ag film tends to undergo film breaking (i.e., break in the continuity of the film), so that film breaking occurs (the continuity of the film is broken). In such a case, the conductivity of the Ag film is lost, resulting in a remarkable reduction in electromagnetic shielding characteristics. Further, unlimited number of white points occur due to the aggregation on the Ag film-applied substrate surface of glass, film, or the like, resulting in reductions of designability and salability.

As techniques for improving the aggregation of such an Ag film, various techniques have been proposed. For example, in JP-A No. 315874/1995, there is proposed a heat ray-shielding glass obtained by forming a metal thin film prepared by adding at least one element selected from the group consisting of Pd, Pt, Sn, Zn, In, Cr, Ti, Si, Zr, Nb, and Ta in an amount of 5 to 20 mol % to Ag on the surface of a glass plate.

Whereas, in JP-A No. 293379/1996, there is proposed a technique for stacking a metal layer containing Ag as a main component, and Pd in an amount of 0.5 to 5 at % based on the amount of Ag, and transparent dielectric layers each containing one or more metal oxides selected from the group consisting of Zn, In, and Sn on a substrate in such a manner that the metal layer is sandwiched between the transparent dielectric layers.

Further, in JP-A No. 135096/1997, there is proposed an electromagnetic-shielding substrate obtained by adding one or more elements selected from the group consisting of Pb, Cu, Au, Ni, Zn, Cd, Mg, and Al in an amount of 3 at % to Ag. Whereas, in JP-A No. 231122/1999, there is disclosed a technique for attaining the improvement of the aggregation resistance of Ag by adding Pb, Cu, Au, Ni, Pd, Pt, Zn, Cd, Mg, and Al to Ag.

Still further, the present inventors have proposed a technique for attaining the improvement of the aggregation resistance of Ag by adding Sc, Y, and rare earth elements to Ag (JP-B No. 351572/2001).

Even with the proposals or the proposed Ag alloy films, the aggregation of Ag proceeds with passage of time, resulting in deterioration of the Ag alloy films. For this reason, for example, when the film is used with its surface coated with each of the Ag alloy films exposed to air, the aggregation of Ag occurs centering on the defective portions of the transparent film covering the Ag alloy film. Therefore, the result is that the film must be processed into a laminated glass or an insulating glass for use so that the Ag alloy film surface is not exposed to air, leading to an increase in manufacturing cost. Further, also in the case where the film is processed into a laminated glass or an insulating glass, white points occur unless it is processed into a laminated glass or an insulating glass immediately after Ag film formation. This results in a loss of the value in use as a commercially available product. Further, even in the case where it has been processed into a laminated glass or an insulating glass, the resulting glass does not have sufficient durability because long-term use results in deterioration of the Ag alloy film.

Incidentally, in recent years, a reflection type liquid crystal display device operating with a small power consumption because a lamp is not required to be included therein has received attention. An optical reflective film is essentially disposed as a reflector on the back of the reflection type liquid crystal display device. It reflects indoor light, natural light, or the like, and serves as a light source for image formation. For this reason, the higher the reflectance of the optical reflective film is, the brighter and the easier to see the formed image is.

Conventionally, a thin film of Al with a high reflectance has been used as the optical reflective film. However, in recent years, a thin film composed almost exclusively of Ag (Ag thin film) which has higher reflectance, and is also resistant to chemical corrosion has come into use as the optical reflective film.

However, in the case where the Ag thin film has been exposed into air for a long time under high temperatures during manufacturing of a liquid crystal display device, in the case where it has been exposed under high temperatures and high humidities for a long time during use after manufacturing, or in other cases, white turbidity and white points caused by the increase in size of crystal grains, the aggregation of Ag atoms, the oxidation of Ag, or the like occur, resulting in a decrease in reflectance. For this reason, it has not been possible to obtain a high reflectance inherent in Ag. Further, the inevitable heat history (to 200° C.) during device manufacturing causes the crystal grain growth and the aggregation of Ag atoms, which involve the increase in roughness of the thin film surface and the anomalous grain growth. This results in a difficulty in device formation, and a further reduction in reflectance.

Under such circumstances, a proposal has been made in which different kinds of elements are added to Ag for the purpose of preventing the growth of crystal grains of Ag and the aggregation of Ag atoms, and allowing high optical reflectance inherent in Ag to be exerted and kept.

For example, in JP-A No. 134300/1995, there is disclosed a thin film made of a metal which is more susceptible to oxidation than silver, specifically, a silver alloy (Ag base alloy) containing one, or two or more metals selected from the group consisting of magnesium, aluminum, titanium, zirconium, and hafnium.

Whereas, in JP-A No. 230806/1997, there is disclosed a thin film made of a silver-based metal material (Ag base alloy) which is an alloy with different kinds of elements for preventing the migration of silver element, specifically, one, or two or more kinds of metals selected from the group consisting of aluminum, copper, nickel, cadmium, gold, zinc, and magnesium.

However, even with the forgoing prior-art techniques, it has not been possible to sufficiently suppress the growth of crystal grains of Ag and the aggregation of Ag atoms. Accordingly, it has not been possible to ensure high optical reflectance inherent in Ag.

SUMMARY OF THE INVENTION

In view of the foregoing circumstances, the present invention has been completed. It is therefore a first object of the present invention to provide an Ag base alloy reflective film or semi-transmissive reflective film for an optical information recording medium having high reliability as use for a high-speed DVD or a next-generation optical disk, and an optical information recording medium including the reflective film or the semi-transmissive reflective film by finding an Ag base alloy having higher thermal conductivity/higher reflectance/higher durability than those of pure Ag or conventional Ag alloys.

It is a second object of the present invention to provide an electromagnetic-shielding Ag alloy film which is less likely to undergo aggregation of Ag, and therefore has excellent durability, and an electromagnetic-shielding Ag alloy film-formed product.

It is a third object of the present invention to provide a high-performance optical reflective film having high optical reflectance almost equal to the high optical reflectance inherent in Ag, and a liquid crystal display device using the optical reflective film by finding an Ag base alloy capable of preventing the growth of crystal grains of Ag and the aggregation of Ag atoms as much as possible.

It is a fourth object of the present invention to provide a sputtering target usable for deposition of the foregoing various Ag alloy films.

The Ag base alloy thin film of the present invention, which attains any object described above, contains at least one element selected from the group consisting of Bi and Sb, and has a total content of Bi and Sb of 0.005 to 10 atom % (at %, hereinafter). In this Ag base alloy thin film, the thickness of the Ag base alloy thin film is preferably set at 3 to 300 nm. Whereas, the Ag base alloy thin film preferably further comprises at least one of rare earth metal elements. The rare earth metal element is preferably at least one of Nd and Y.

When a thin film comprises an Ag base alloy having a total content of Bi and Sb of 0.005 to 0.40 at %, the Ag base alloy thin film has all of high thermal conductivity/high reflectance/high durability, and attains the first object. Herein, it is preferable that the Ag base alloy further comprises at least one selected from the group consisting of Nd and Y, and that the total content of the elements of the group is 0.1 to 2 at %. Whereas, it is preferable that the Ag base alloy further comprises at least one selected from the group consisting of Cu, Au, Rh, Pd, and Pt, and that the total content of the elements of the group is 0.1 to 3 at %.

When a thin film comprises an Ag base alloy having a total content of Bi and Sb of 0.01 to 10 at %, the Ag base alloy thin film is less likely to undergo aggregation of Ag, and therefore has excellent durability, and attains the second object. Herein, it is preferable that the Ag base alloy further comprises at least one element selected from the group consisting of Cu, Au, Pd, Rh, Ru, Ir, and Pt, and that the total content of the elements of the group is 0.3 at % or more.

When a thin film comprises an Ag base alloy having a total content of Bi and Sb of 0.01 to 4 at %, the Ag base alloy thin film is capable of preventing the growth of crystal grains of Ag and the aggregation of Ag atoms as much as possible, as well as has high optical reflectance roughly equal to the high optical reflectance inherent in Ag, and attains the third object. Herein, it is preferable that the Ag base alloy further comprises rare earth metal elements in an amount of 0.01 to 2 at %, and that the rare earth metal element is at least one of Nd and Y.

A sputtering target for forming an Ag base alloy thin film of the present invention, which attains the foregoing objects, comprises at least one of Bi: 0.05 to 23 at % and Sb: 0.005 to 10 at %.

When the sputtering target for forming an Ag base alloy thin film comprises Bi in an amount of 0.05 to 4.5 at % or Sb in an amount of 0.005 to 0.40 at %, it is suitable for deposition of the Ag base alloy thin film having all of high thermal conductivity/high reflectance/high durability.

When at least one of Bi: 0.2 to 23 at % and Sb: 0.01 to 10 at % is satisfied in terms of the content in the sputtering target, and the Bi content and the Sb content in the sputtering target satisfy the following formula (1), the sputtering target is suitable for deposition of the Ag base alloy thin film which is less likely to undergo aggregation of Ag, and therefore has excellent durability:

$$0.01 \text{ at } \% \leq 0.000502x^3 + 0.00987x^2 + 0.0553x + y \leq 10 \text{ at } \% \quad \text{Formula (1)}$$

where, in the formula (1), x denotes the Bi content (at %) in the Ag alloy sputtering target, and y denotes the Sb content (at %) in the Ag alloy sputtering target; and at % denotes at %. Whereas, it is preferable that the sputtering target further comprises at least one element selected from Cu, Au, Pd, Rh, Ru, Ir, and Pt in an amount of 0.3 at % or more.

When at least one of Bi: 0.2 to 15 at % and Sb: 0.01 to 4 at % is satisfied in terms of the content in the sputtering target, and the Bi content and the Sb content in the sputtering target satisfy the following formula (2), the sputtering target is suitable for deposition of the Ag base alloy thin film which is capable of preventing the growth of crystal grains of Ag and the aggregation of Ag atoms as much as possible, as well as has high optical reflectance roughly equal to the high optical reflectance inherent in Ag $$0.01 \text{ at } \% \leq 0.000502x^3 + 0.00987x^2 + 0.0553x + y \leq 4 \text{ at } \% \quad \text{Formula (2)}$$

where, in the formula (2), x denotes the Bi content (at %) in the Ag alloy sputtering target, and y denotes the Sb content (at %) in the Ag alloy sputtering target; and at % denotes at %.

The Ag base alloy thin film having a total content of Bi and Sb of 0.005 to 0.40 at % is preferably used as a reflective film or a semi-transmissive reflective film for an optical information recording medium.

The Ag base alloy thin film having a total content of Bi and Sb of 0.01 to 10 at % is preferably used as an electromagnetic-shielding film. The electromagnetic-shielding film preferably has a layer in which at least one content of Bi and Sb is higher than inside the Ag base alloy thin film on at least one of the surface and the interface of the Ag base alloy thin film. Further, in the electromagnetic-shielding film, the layer in which at least one content of Bi and Sb is higher contains at least one of oxidized Bi and oxidized Sb.

The Ag base alloy thin film having a total content of Bi and Sb of 0.01 to 10 at % is also preferably used as an electromagnetic-shielding film-formed product. The electromagnetic-shielding film-formed product can be configured such that a film containing at least one selected from the group consisting of oxide, nitride, and oxynitride is formed as an underlayer on the substrate, the Ag base alloy thin film is formed on the underlayer, and a film containing at least one selected from the group consisting of oxide, nitride, and oxynitride is formed as a protective film on the Ag base alloy thin film. Herein, it is preferable that the underlayer and the protective layer are oxides or oxynitrides. Then, it is preferable that the oxide is at least one selected from the group consisting of ITO, zinc oxide, tin oxide, and indium oxide. Further, it is preferable that the thicknesses of the underlayer and the protective layer are 10 nm or more and 1000 nm or less. The electromagnetic-shielding film-formed product is preferably configured such that the substrate is a transparent substrate; a transparent member is further stacked on the protective layer; or a transparent member is stacked on the protective layer via a spacer, and a space layer is disposed between the protective layer and the transparent member. It is preferable that, in the electromagnetic-shielding film-formed product, the thickness of the Ag base alloy thin film is 3 nm or more and 20 nm or less.

The Ag base alloy thin film having a total content of Bi and Sb of 0.01 to 4 at % is preferably used as an optical reflective film for use as a reflection electrode or a reflector of a liquid crystal display device.

If the Ag base alloy of the present invention is used as a reflective film or a semi-transmissive film for an optical information recording medium, it becomes possible to significantly enhance the recording and reproduction characteristics and the reliability of the optical information recording medium (particularly, a high speed DVD or a next-generation optical disk) because the film has high thermal conductivity/ high reflectance/high durability. Whereas, the sputtering target for forming an Ag base alloy thin film of the present invention is preferably used for the deposition of a reflective film or a semi-transmissive reflective film of the optical information recording medium. The reflective film or the semi-transmissive reflective film deposited using this is excellent in alloy composition, alloy element distribution, and in-plane uniformity of film thickness. In addition, the reflective film or the semi-transmissive reflective film has a low content of impurity components, and hence it is favorably exploited to show high performances (high thermal conductivity, high reflectance, and high durability) as a reflective film, which allows the production of high-performance high-reliability optical information recording medium. Further, the optical information recording media having the reflective film and the semi-transmissive reflective film becomes capable of significantly enhance the recording and reproduction characteristics and the reliability.

Whereas, if the Ag base alloy of the present invention is used as an electromagnetic-shielding film, the aggregation of Ag is less likely to occur, and therefore, the reduction in electromagnetic shielding property, generation of white points, and the like, due to the loss of conductivity caused by aggregation of Ag are less likely to occur. It is possible to improve the durability in terms of such points. The sputtering target for forming an Ag base alloy thin film of the present invention is preferably used for the deposition of an electromagnetic shielding film.

Whereas, if the Ag base alloy of the present invention is used as an optical reflective film, it is possible to provide a high-performance optical reflective film having high optical reflectance roughly equal to the high optical reflectance inherent in Ag, and a liquid crystal display device using the optical reflective film. The sputtering target for forming an Ag base alloy thin film of the present invention is preferably used for the deposition of the optical reflective film of such a liquid crystal display device.

DETAILED DESCRIPTION OF THE PREFERRED EMBODIMENTS

Figure 1:
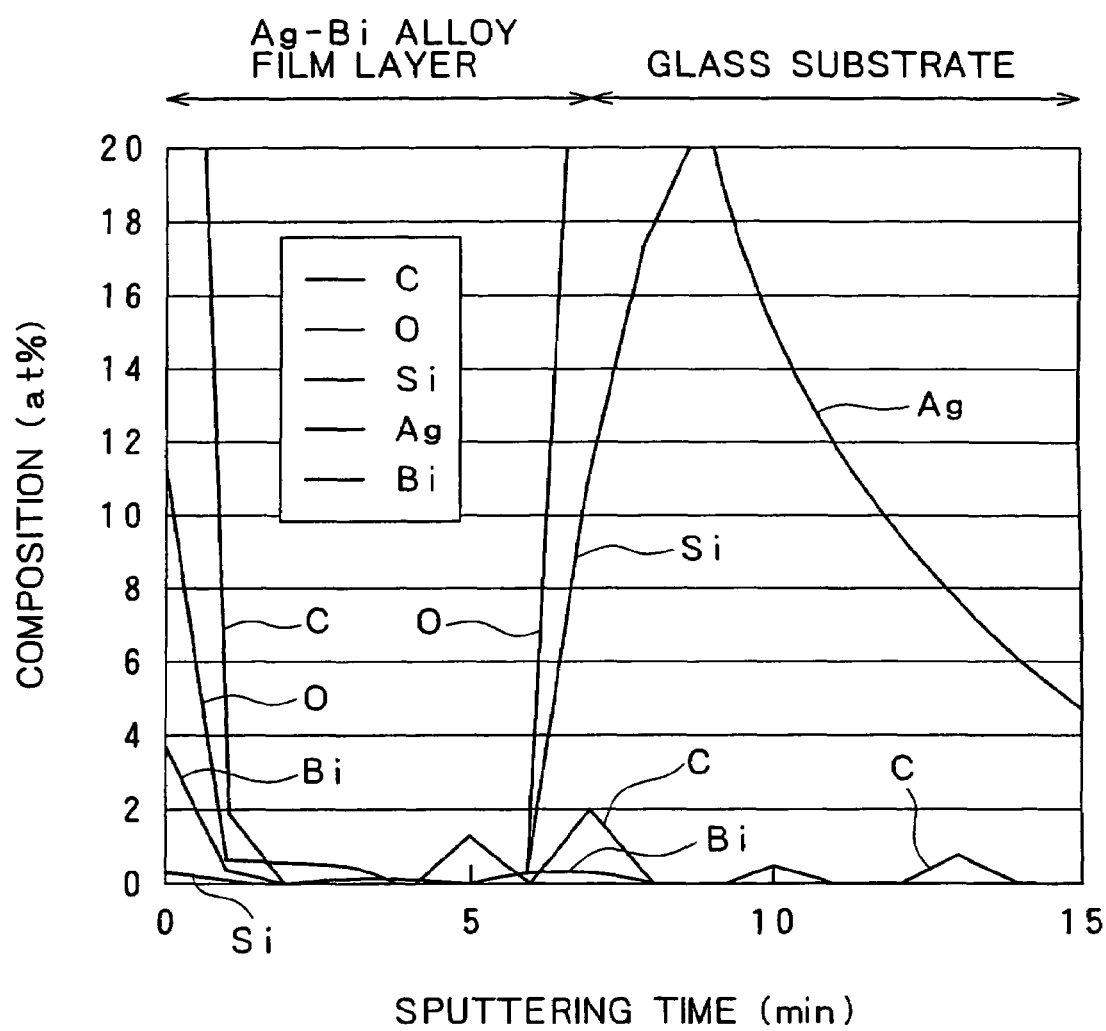
FIG. 1 is a diagram showing the results of the composition analysis along the thickness of the film with X-ray photoelectron spectroscopy on an Ag—Bi alloy film, which shows the relationship between the sputtering time and the composition in the X-ray photoelectron spectroscopy.

First, an embodiment of a first invention will be described.

The present inventors have conducted a close study under the foregoing problems in order to provide an Ag base alloy reflective film or semi-transmissive reflective film for an optical information recording medium having high thermal conductivity, high reflectance, and high durability. As a result, they found that an Ag base alloy containing Bi and/or Sb in a total amount of 0.005 to 0.40% has high reflectance and high thermal conductivity comparable to those of pure Ag, and is capable of exhibiting a higher level of durability than that of pure Ag, leading to the completion of the present invention. Below, the present invention will be described in details.

An Ag base alloy reflective film or semi-transmissive reflective film for an optical information recording medium of the present invention comprises an Ag base alloy containing Bi and/or Sb in a total amount of 0.005 to 0.40% as an essential element. Such a reflective film or a semi-transmissive reflective film comprising the Ag base alloy not only has high thermal conductivity and high reflectance comparable to those of pure Ag, but also has excellent durabilities (thermal stability and chemical stability).

In general, a pure Ag thin film deposited by a sputtering process or the like includes a large number of crystal defects (such as void, dislocation, and grain boundary). Ag atoms are readily diffused through the crystal defects. Therefore, when a pure Ag thin film is held under a high temperature high humidity environment, Ag atoms are diffused/aggregated at various sites, resulting in increases in surface roughness and crystal grain size. Whereas, also when put under an environment containing halogen ions such as chlorine ions, Ag atoms are readily diffused/aggregated. The changes in thin film surface caused by such an aggregation entails a reduction in reflectance, which remarkably deteriorates the recording and reproduction characteristics of an optical disk. In particular, with a very thin semi-transmissive reflective film used for a DVD-ROM, the effect of aggregation exerted on the reflectance is large, so that the reproduction characteristics of an optical disk are remarkably deteriorated.

As the solving measures for the foregoing problems, alloying of Ag has been studied so far. For example, alloying through the addition of a noble metal element (such as Au, Pd, or Pt) to Ag, or through the addition of a rare earth metal element (such as Y), has been proposed.

If a noble metal element (such as Au, Pd, or Pt) is added to Ag for alloying, the aggregation of Ag atoms due to the effects of chlorine ions, or the like is suppressed. However, it is not possible to suppress the aggregation of Ag atoms due to holding under high temperatures and high humidities. Whereas, with a method in which a rare earth metal element (such as Y) is added for alloying, the aggregation of Ag atoms due to holding under high temperatures and high humidities is suppressed. However, it is not possible to suppress the aggregation of Ag atoms due to the effects of chlorine ions or the like. Namely, even with alloying using either of the element groups, it is not possible to simultaneously suppress the aggregations of Ag atoms resulting from both of holding under high temperatures and high humidities and the effects of chlorine ions.

However, in accordance with the present invention, by adopting an Ag base alloy containing Bi and/or Sb in a total amount of 0.005% or more, it is possible to simultaneously suppress the aggregations of Ag atoms due to holding under high temperatures and high humidities and the effects of chlorine ions. Further, it has been shown that these elements exhibit a more clear aggregation suppression effect with an increase in its content. However, the addition of such an element to Ag tends to reduce the thermal conductivity and the reflectance relative to the pure Ag thin film. This tendency becomes more noticeable with an increase in content of the element. This results in reductions in the thermal conductivity and the reflectance of the Ag base alloy thin film.

As for the content of the elements, the upper limit of the total content can be raised up to 3% from the viewpoint of ensuring high reflectance with respect to a violet laser for use in a next-generation optical disk. However, if the total content exceeds 0.40%, it becomes impossible to ensure high thermal conductivity required of the reflective film of a high-speed DVD or a next-generation optical disk. Therefore, the upper limit of the total content has been set at 0.40% as the requirement for ensuring both the characteristics of high reflectance and high thermal conductivity. On the other hand, if the total content is less than 0.005%, the aggregation suppression effect through the addition of Bi and/or Sb is not effectively exhibited. It is preferably 0.01% or more and 0.3% or less, and more preferably 0.05% or more and 0.2% or less. Incidentally, in consideration of manufacturing of a sputtering target, or the like, Bi is preferably used from the viewpoint of excellent handling.

In the present invention, for the purpose of further improving the durability, particularly the thermal stability of an Ag base alloy containing Bi and/or Sb, it is also effective to allow rare earth metal elements to be contained therein other than the foregoing elements. These elements have effects of further suppressing the aggregation of Ag atoms due to holding under high temperatures and high humidities, and still further enhancing the durability. As the rare earth metal element, Nd and/or Y is preferred. The content of these elements based on the amount of the Ag base alloy is preferably set at 0.1% or more and 2% or less in a total amount of Nd and/or Y. This is for the following reason: if the content is less than 0.1%, effective effects through the addition of the elements cannot be produced, and if the content exceeds 2%, high thermal conductivity cannot be obtained. The more preferred content upper limit is 1%, and more preferably 0.5%.

Further, at least one selected from Cu, Au, Rh, Pd, and Pt may also be added for the purpose of improving the durability, particularly the chemical stability of the Ag base alloy containing Bi and/or Sb. These elements have effects of further suppressing the aggregation of Ag atoms due to the effects of chlorine ions, and still further enhancing the durability. In order for the aggregation suppression effect of Ag atoms to be effectively exhibited, the total content is set at preferably 0.1% or more and 3% or less. The more preferred upper limit is 2%.

Whereas, in order to attain the further improvement of the chemical stability of the Ag base alloy, it is also effective to add Mg, Ti, and Zn in addition to the foregoing elements. The addition of these elements produces a lower durability improvement effect than with Au, Rh, Pd, and Pt. However, it is useful for achieving a cost reduction of an optical disk because of its low raw material cost. Incidentally, Mg, Ti, and Zn reduce the thermal conductivity and the reflectance with an increase in content thereof. Therefore, the upper limit of the total content of these elements is set at 3%. As for the foregoing alloy element group, even addition of one kind can produce a sufficient effect. However, it is needless to say that it is possible to produce the same effect even for the addition of two or more kinds in combination. However, the foregoing effects obtainable through the addition of Nd and/or Y as a rare earth metal element, and the foregoing effects obtainable through the addition of at least one selected from Cu, Au, Rh, Pd, and Pt are the inherent effects observable for the Ag base alloy containing Bi and/or Sb. For example, the same effects are not observable with pure Ag.

As also disclosed in JP-A No. 184725/2001, there is known an Ag alloy which has been improved in corrosion resistance by adding at least one element selected from Al, Au, Cu, Co, Ni, Ti, V, Mo, Mn, Pt, Si, Nb, Fe, Ta, Hf, Ga, Pd, Bi In, W, and Zr in an amount of 0.5 to 5% to Ag. However, Al, Au, Cu, Pt, and Pd do not have an effect of suppressing the aggregation of Ag atoms occurring when the Ag film has been held at high temperatures. As a result, it is not possible to obtain the durability improvement effect from the viewpoint of the thermal stability mentioned as the object in the present invention.

Whereas, addition of Bi in an amount of 0.5% or more reduces the thermal conductivity, and hence it is not preferred, and excluded from the present invention. Further, in JP-A No. 92959/2002, there is disclosed an Ag alloy which has been improved in chemical stability by adding Cu in an amount of 4 to 15 mass %, and Al, Zn, Cd, Sn, Sb, and Ir in an amount of 0.5 mass % or more to Ag. However, Cu, Al, Zn, Cd, Sn, and Ir do not produce an effect of suppressing the aggregation of Ag atoms due to holding under high temperatures. Whereas, addition of Sb in an amount of 0.5 mass % (0.44%) or more reduces the thermal conductivity inherent in Ag, and hence it is not preferred. Therefore, these known Ag alloys are distinctly distinguished from the present invention in terms of the specific constitution and functional effects.

The Ag base alloy reflective film and the Ag base alloy semi-transmissive reflective film for optical information recording media of the present invention can be obtained by depositing the Ag base alloy of the foregoing alloy composition on a substrate with a vacuum deposition process, an ion plating process, a sputtering process, or the like. Out of these, the film deposited by a sputtering process is recommendable. This is for the following reason. The Ag base alloy reflective film and the Ag base alloy semi-transmissive reflective film deposited by a sputtering process are superior in alloy element distribution and the in-plane uniformity of the film thickness to the films deposited by other deposition process. As a result, the film is favorably exploited to show higher level of characteristics (high thermal conductivity, high reflectance, and high durability) as a reflective film, which allows the production of high-performance high-reliability optical disk.

The Ag base alloy reflective film for an optical information recording medium in the present invention is a thin film for use as a reflective film for single-layer recording for performing recording only on one side of a disk, or the uppermost layer reflective film for multilayer recording. The transmittance is almost 0%, and the reflectance is defined by the constitution of the disk, and about 45% or more. Whereas, the film thickness may be appropriately determined in such a range as to meet the foregoing reflectance and transmittance, and it may be normally set at about 50 to 200 nm.

The semi-transmissive reflective film of the present invention is a film for use as a reflective film of a medium for performing two or more multilayer recording on one side of a disk. The transmittance/reflectance are defined according to the configuration of the disk. The semi-transmissive reflective film denotes a thin film having a transmittance of about 60 to 72% and a reflectance of about 18 to 30% Further, the thickness thereof may be appropriately determined in such a range as to meet the foregoing reflection and transmittance requirements, and it may be normally set at about 5 to 20 nm.

The Ag base alloy sputtering target for an optical information recording medium of the present invention can be manufactured by any method of a dissolution/casting process, a powder sintering process, a spray forming process, and other processes. Out of these, manufacturing by a vacuum dissolution/casting process is recommendable. This is for the following reason. The Ag base alloy sputtering target manufactured by the vacuum dissolution/casting process has a lower content of impurity components such as nitrogen and oxygen than that of the one manufactured by other process. As a result, the reflective film or the semi-transmissive reflective film deposited by using the sputtering target is effectively exploited to show high characteristics (high thermal conductivity, high reflectance, and high durability) as a reflective film, which allows the production of high-performance high-reliability optical disk.

The reflective film or the semi-transmissive reflective film of the present invention essentially contains Bi and/or Sb in an amount of 0.005 to 0.40% as described above. In particular, in order to obtain a thin film of a composition such that the Bi content falls within the foregoing range, Bi is required to be contained in an amount of about 0.05 to 4.5% in the sputtering target.

For a thin film of a general alloy system such as Ag—Cu alloy system, Ag-noble metal alloy system, or Ag-rare earth metal alloy system, the composition of the sputtering target is roughly in agreement with the composition of the thin film. In contrast, when a thin film has been deposited using a Bi-containing Ag base alloy sputtering target, the Bi content in the thin film is reduced to several percent to several tens of percent of the Bi content in the sputtering target.

This is considered to be caused by the following: (1) Bi is revaporized from the substrate side during film deposition because of the large difference in melting point between Ag and Bi, or the higher vapor pressure of Bi than that of Ag; (2) Bi is difficult to sputter because the sputtering rate of Ag is higher than the sputtering rate of Bi; further (3) only Bi is oxidized on the sputtering target surface and is not be sputtered because Bi is more susceptible to oxidation than Ag; or other factors. For these reasons, it is conceivable that the Bi content in the thin film is reduced as compared with the Bi content in the sputtering target.

Therefore, the Bi content in the sputtering target in accordance with the present invention is required to be set larger than each Bi content in the objective reflective film and semi-transmissive reflective film. For example, in order to obtain a reflective film and a semi-transmissive reflective film each containing Bi in an amount of 0.005 to 0.40%, the Bi content in the sputtering target may be set at 0.05% or more and 4.5% or less, and preferably 0.1% or more and 3.6% or less in consideration of the content of Bi which will not be incorporated into the film.

The foregoing phenomenon is the phenomenon not observable for other Ag base alloys such as Ag—Sb alloy system and Ag-rare earth metal alloy system. As for these Ag base alloys, the sputtering targets are roughly in agreement in terms of composition with their respective thin films deposited using these. Therefore, also in the present invention, for other elements than Bi, sputtering targets containing respective elements in such a range as to meet the foregoing requirements may be manufactured.

The optical information recording medium of the present invention may include the Ag base alloy reflective film or semi-transmissive reflective film of the present invention. There is no other particular restriction on the constitution as the optical information recording medium. In the optical information recording medium field, all known constitutions are adoptable. For example, the optical information recording medium including the reflective film or semi-transmissive reflective film made of the foregoing Ag base alloy on one side of a transparent substrate of polycarbonate or the like has high reflectance, high thermal conductivity, and high durability. Therefore, as a matter of course, it can be used as a read-only, writing once, writable, or other type of optical information recording medium, as well as it can also be preferably used for a high-speed DVD or a next-generation optical disk.

Then, an embodiment of a second invention will be described.

The present invention is carried out, for example, in the following manner.

A sputtering target (an Ag alloy sputtering target for forming the electromagnetic-shielding Ag alloy film in accordance with the present invention) is manufactured which comprises an Ag alloy containing at least one of Bi: 0.2 to 23 at % and Sb: 0.01 to 10 at % (below, also referred to as at %), and having a Bi content and a Sb content satisfying the following formula (2-1). By using the sputtering target, an Ag alloy film (the electromagnetic-shielding Ag alloy film in accordance with the present invention) containing Bi and/or Sb in a total amount of 0.01 to 10 at % is deposited on a substrate made of a transparent glass or the like by a sputtering process. As a result, it is possible to obtain an electromagnetic-shielding Ag alloy film-formed product in accordance with the present invention.

$$0.01 \text{ at } \% \leq 0.000502x^3 + 0.0987x^2 + 0.0553x + \text{Sb content} \leq 10 \text{ at } \% \quad \text{Formula (2-1)}$$

Where, in the formula (2-1), x denotes the Bi content (at %) in the sputtering target (Ag alloy), and the Sb content denotes the Sb content (at %) in the sputtering target (Ag alloy); and at % denotes the same meaning as atom %.

The present invention is carried out in this manner.

For attaining the foregoing objects of the present invention, the present inventors formed Ag alloy thin films of various compositions on substrates by a sputtering process using Ag base alloy sputtering targets manufactured by adding various elements to Ag, and evaluated the thin films for the characteristics as the electromagnetic-shielding Ag alloy films. As a result, they found as follows. By implementing an Ag alloy film containing Bi and/or Sb, the migration of Ag is suppressed, so that aggregation becomes less likely to occur. This finding has led to the completion of the present invention. Below, the details thereof will be described.

"An Ag alloy film comprising an Ag base alloy containing Sc, Y, and one or more elements of rare earth elements (JP-B No. 351572/2001)" previously invented by the present inventors has more excellent Ag aggregation resistance as compared with a pure Ag film or an Ag alloy film comprising an Ag base alloy containing one or more elements of Pd, Pt, Sn, Zn, In, Cr, Ti, Si, Zr, Nb, and Ta. Therefore, it shows characteristics excellent in durability (the Ag alloy film will not be deteriorated even after long-term use) and weather resistance (Ag aggregation resistance to a high-temperature high-humidity environment).

In contrast, the present inventors have found as follows. The Ag alloy film (the electromagnetic-shielding Ag alloy film comprising an Ag alloy containing Bi and/or Sb in a total amount of 0.01 to 10 at %) in accordance with the present invention is more excellent in effect of suppressing the aggregation of Ag, and exerts a sufficient effect through the addition of a tracer amount of them. In addition, it is possible to still further reduce the electric resistance.

Further, the present inventors have found as follows. The foregoing "Ag alloy film comprising an Ag base alloy containing Sc, Y, and one or more elements of rare earth elements (JP-B No. 351572/2001)" is excellent in durability to oxygen and moisture in air. However, it cannot acquire a sufficient resistance in an atmosphere containing a halogen element such as salt water. In contrast, the Ag alloy film in accordance with the present invention also exhibits a sufficient resistance to salt water.

For the Ag alloy film in accordance with the present invention, by appropriately controlling the amount of additive elements (Bi and/or Sb) to be added, it is possible to obtain an Ag alloy film capable of exerting the characteristics (i.e., infrared-shielding property and radio wave-shielding property) corresponding to the wavelength of an electromagnetic wave. Incidentally, in the present invention, in the case where the alloy film is mentioned as for infrared-shielding, it means that the alloy film has the shielding property against long wavelength ($\lambda$) of $8 \times 10^{-7}$ m or more. Whereas, for the wavelength ($\lambda$) in the case where the alloy film is mentioned as for electromagnetic-shielding, it means that the alloy film has the shielding property against long wavelengths of $10^{-3}$ m or more.

As for the amounts (contents) of the additive elements (Bi and/or Sb), the total amount thereof is required to be set at 0.01 to 10 at %.

If Bi and/or Sb is added in a total amount of 0.01 at % or more, it is possible to effectively inhibit the growth of crystal grains caused by the surface diffusion of Ag. In particular, the Ag alloy film containing Bi and/or Sb in a total amount of 0.05 at % or more is more excellent in chemical stabilities (particularly, weather resistance) than a pure Ag film. Therefore, even if it is exposed under a high-temperature high-humidity environment, the aggregation suppression effect of the Ag alloy film is high, and the electromagnetic shielding property is also very excellent.

In particular, for a substrate made of an oxygen-containing compound, Bi and/or Sb has a high affinity with oxygen, and hence it is diffused and concentrated in the substrate interface, resulting in an improvement in adhesion. As a result, the aggregation of Ag is further reduced. Further, if the Ag alloy film surface is exposed to an atmosphere in which oxygen is present, Bi and/or Sb in the Ag alloy film is diffused and concentrated in the surface of the Ag alloy film to form an oxide layer (Bi and/or Sb oxide layer). The oxide layer cuts off the contact with environment, so that the effect of suppressing aggregation of Ag is further enhanced.

Figure 2:
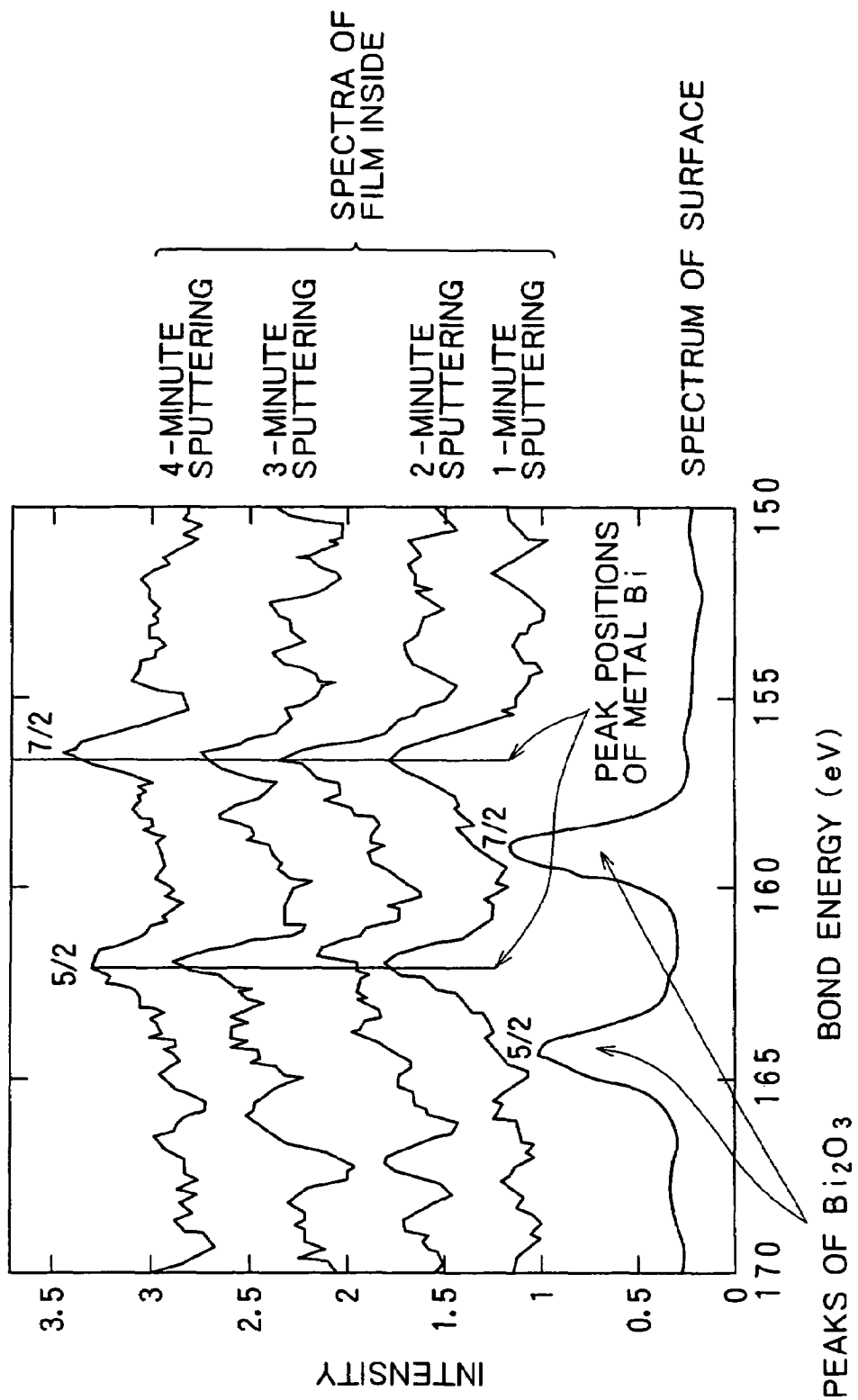
FIG. 2 is a diagram showing the narrow-range spectrum measurement results of Bi with X-ray photoelectron spectroscopy on an Ag—Bi alloy film, which shows the relationship between the bond energy and the intensity.

FIGS. 1 and 2 respectively show the results of composition analysis along the thickness of the film with XPS (X-ray photoelectron spectroscopy) of an Ag—Bi alloy film with a thickness of about 20 nm formed on a glass substrate (FIG. 1) and the narrow-range spectra of Bi (FIG. 2). As indicated, Bi is concentrated in the outermost surface. Further, the narrow-range spectra of Bi indicates that the concentrated Bi in the outermost surface forms an oxide. On the other hand, the narrow-range spectra of Bi according to XPS of the Ag—Bi alloy film inside after 1-minute, 2-minute, 3-minute, and 4-minute sputtering from the surface of the film provides peaks showing metal Bi. This indicates that only the outermost surface is oxidized. Further, the thickness of the oxide layer was analyzed with the RBS (Rutherford back scattering) analysis, and as a result, it was found to be a thickness of several atomic layers. Whereas, also at the interface between the glass substrate and the Ag alloy film, the Bi composition is higher than that of the Ag alloy film inside, and it is observable that Bi is concentrated.

Bi and/or Sb is desirably contained in an amount of 0.05 at % or more from the viewpoint of densely forming the oxide layer of Bi and/or Sb, and cutting off the contact with environment. Namely, the lower limit value of the more preferred additive element (Bi and/or Sb) content is 0.05 at %.

The upper limit value of the amount of the additive element (Bi and/or Sb) to be added is set at 10 at % because the element addition effect is saturated, and the visible light transmittance may be reduced even if the amount added is increased. Incidentally, when the alloy film is used as an infrared-shielding Ag alloy film, the upper limit value is set at desirably 5 at % or less, further desirably 3 at % or less, and still further desirably 1 at % or less. When the alloy film is used as an electromagnetic-shielding Ag alloy film, the upper limit value is recommendably set at 5 at % because the electric resistance of the Ag alloy film increases with an increase in amount added, so that sufficient electromagnetic shielding property may not be obtained. The more preferred upper value is 3 at %, and the further preferred upper value is 1 at %. In particular, in order that an excellent electromagnetic shielding property against long wavelengths of a wavelength of $10^{-1}$ m or more is exerted, the upper limit value is desirably set at 5 at % to reduce the electric resistance. The more preferred upper limit value is 3 at %, and the further preferred upper limit value is 1 at %. Incidentally, the amount added (content) herein mentioned is the composition of Bi and/or Sb relative to the whole Ag alloy film including the concentrated layer of Bi and/or Sb.

The electromagnetic-shielding Ag alloy film in accordance with the present invention, as described above, contains Bi and/or Sb in a total amount of 0.01 to 10 at %. In this case, if the film is configured so as to further contain at least one or more elements selected from Cu, Au, Pd, Rh, Ru, Ir, and Pt in an amount of 0.3 at % or more in addition to these components, the chemical stability of Ag is further improved, and the effect of suppressing the aggregation of Ag is more improved. In particular, these elements (Cu, Au, Pd, Rh, Ru, Ir, and Pt) show a less decrease in reflectance or electric resistance with an increase in amount added. Therefore, by adding these elements in a supplementary manner, the Ag aggregation resisting effect becomes large. The amount of these elements (Cu, Au, Pd, Rh, Ru, Ir, and Pt) to be added is more preferably 0.5 at % (at %) or more, and further preferably 0.8 at % or more. On the other hand, the upper limit of the amount added has no particular restriction. However, if it exceeds 10 at %, the element addition effect is saturated, as well as the visible light transmittance is reduced, and the electric resistance is raised. This may make it impossible to acquire a sufficient electromagnetic shielding property. Therefore, the upper limit of the amount of these elements (Cu, Au, Pd, Rh, Ru, Ir, and Pt) to be added is preferably set at 10 at %, more preferably 8 at % or less, and further preferably 5 at % or less. Whereas, if rare earth elements such as Sc, Y, and Nd are added to the Ag alloy film in accordance with the present invention, the aggregation property of Ag is further suppressed. The amount of these to be added is preferably 0.1 at % or more, and further preferably 0.2 at % or more. On the other hand, the upper limit is preferably 1 at %, more preferably 0.8% or less, and most preferably 0.6 at % or less from the viewpoint of electric resistance.

Further, other components than the foregoing components may also be added in such a range as not to impair the function of the present invention according to the intended purpose. As such components, for example, Ta, Co, Zn, Mg, Ti, and the like may be positively added. Incidentally, it does not matter that the impurities previously included in the raw material are contained in the film.

The thickness of the electromagnetic-shielding Ag alloy film in accordance with the present invention has no particular restriction. It may be appropriately changed according to the required characteristics such as electromagnetic shielding characteristic and visible light transmittance. It is preferably 3 nm or more and 20 nm or less. When it is less than 3 nm, the electromagnetic shielding characteristic may not be satisfactorily obtainable. From such a viewpoint, the thickness is preferably 5 nm or more, and further preferably 8 nm or more. Incidentally, when the film is used for radio wave-shielding, the film thickness is preferably 5 nm or more, more preferably 8 nm or more, and further preferably 10 nm. Whereas, the film thickness is set at preferably 20 nm or less, more preferably 18 nm or less, and further preferably 15 nm or less, from the viewpoint of obtaining a sufficient visible light transmittance.

In the present invention, in order to reduce the glaring feeling due to reflection of a visible light by the Ag alloy film, another film may also be formed other than the Ag alloy film. For example, an underlayer may also be disposed between the substrate and the electromagnetic-shielding Ag alloy film. The underlayer to be formed on the substrate has no particular restriction, but it preferably has transparency from the viewpoint of visible light transmittance. Whereas, the underlayer may also be disposed for the purpose of improving the adhesion between the Ag alloy film and the substrate. Further, an underlayer having conductivity is desirable because the heat ray-shielding effect and the electromagnetic-shielding effect are also improved. The underlayer of the composition having characteristics corresponding to the intended purpose may be appropriately selected.

Examples of such an underlayer may include: oxide films each containing an oxide such as zinc oxide, tin oxide, titanium oxide, indium oxide, ITO, yttrium oxide, zirconium oxide, or aluminum oxide, as a main component; nitride films each containing a nitride such as silicon nitride, aluminum nitride, or boron nitride as a main component; and oxynitride films each containing an oxynitride such as sialon. Of course, for example, the underlayer (underlying film) may also be formed by using the foregoing oxides alone, or two or more of the oxides in mixture, or mixtures other than the oxides. The composition of the underlayer has no particular restriction. However, Bi and/or Sb tends to bond to oxygen. Therefore, if oxygen is contained in the underlying film, Bi and/or Sb is also diffused and concentrated in the interface between the underlying film and the Ag alloy film, resulting in an improvement in adhesion. Therefore, out of the foregoing underlying films, a film containing oxygen like oxide or oxynitride is desirable from the viewpoint of improving the adhesion.

These underlayers may be either of single layers or multilayers. When the underlayers are formed in multilayers, the foregoing underlayers and films of other compositions than that of the underlayers may be used in combination to form multilayers. Out of these, use of the one having high refractive index such as titanium oxide as the underlayer can provide satisfactory visible light transmittance while suppressing optical reflection, and hence it is desirable.

The process for forming the underlying film (underlayer) has no particular restriction. The underlying film (underlayer) may be formed on the substrate using a process suitable for the composition of the underlying film. Examples of such a process include a sputtering process, a plasma CVD process, and a sol-gel process.

The film thickness of the underlying film has no particular restriction, but, in general, it is recommendably set at about 10 nm to 1000 nm. If it is less than 10 nm, the intended purpose, for example, achieving of the reduction in optical reflectance while ensuring the satisfactory visible light transmittance may be impossible. Whereas, if it exceeds 1000 nm, the adhesion may be undesirably reduced due to the film stress. More preferably, it is 100 nm or less.

In order to further improve the durability and the weather resistance in addition to the same purposes as with the underlayer, alternatively, in order to further improve the characteristics such as chemical resistance, abrasion resistance, damage resistance, and Ag aggregation resistance according to the usage environment, a protective film may also be disposed on the Ag alloy film.

The protective layer to be formed on the electromagnetic-shielding Ag alloy film has no particular restriction. However, it preferably has transparency from the viewpoint of visible light transmittance. Further, it is recommendably an amorphous film from the viewpoint of durabilities to oxygen and moisture. As such a protective layer, the film having the same composition as that of the underlying film may also be used. The films mentioned as examples of the underlying layers are desirable as protective layers. Out of these, desirably, a material is appropriately selected from aluminum oxide, silicon nitride, aluminum nitride, boron nitride, sialon, and the like to form a protective layer from the viewpoints of abrasion resistance and damage resistance. Whereas, oxides and oxynitrides are preferred from the viewpoints of the weather resistance, and durabilities to an atmosphere containing a halogen element such as salt water. This is for the following reason. When the protective film is an oxide film or an oxynitride film containing oxygen, oxygen is present during deposition, so that Bi and/or Sb is diffused onto the Ag alloy film, and oxidized to form an oxide. As a result, the cut-off property with environment by the oxide layer of Bi and/or Sb is improved as a matter of course. Further, the adhesion with the protective film is improved, and the pinholes in the protective film are reduced in number. Accordingly, the environment cut-off property is further improved. In particular, out of the oxides, ITO, zinc oxide, tin oxide, and indium oxide are preferred in terms of the adhesion with the concentrated layer of Bi and/or Sb and less pinholes. These protective layers may be either single layers or multilayers. When the protective layers are formed in multilayers, the protective layers mentioned above as examples and films of other compositions than that of the protective layers may be used in combination to form multilayers.

The process for forming the protective layer has no particular restriction. The protective layer may be formed on the Ag alloy film using a process suitable for the composition of the protective layer. Examples of such a process include a sputtering process, a plasma CVD process, and a sol-gel process.

The film thickness of the protective layer has no particular restriction, but, in general, it is recommendably set at about 10 nm to 1000 nm. If it is less than 10 nm, the abrasion resistance and the damage resistance may not be satisfactorily obtainable, and pinholes are not satisfactorily reduced in number. Whereas, if it exceeds 1000 nm, the adhesion may be undesirably reduced due to the film stress. More preferably, it is 100 nm or less.

Incidentally, the underlayer, the Ag alloy film, and the protective layer may also be stacked alternately on the substrate.

Examples of the substrate for forming thereon the Ag alloy film (or the underlayer) in accordance with the present invention may include glass, plastic, and resin film. When the film is used for an application in which visible light transmission is required, such as a window pane, a substrate having transparency (i.e., visible light transmittivity) is desirably used. In this case, the substrate has no particular restriction as to the material, composition, thickness, and the like so long as it can transmit a visible light therethrough. Whereas, when the substrate is not required to have transparency, namely, when the Ag alloy film is used mainly for the purpose of electromagnetic shielding, for example, the Ag alloy film is mounted internally in or externally on electronic equipments, it has no particular restriction as to the kind, composition, transparency, thickness, and material of the substrate, and the like.

In the present invention, the substrates may be used alone or in plurality thereof, and the combination thereof has no particular restriction. For the purpose of further improvement of the characteristics, various substrates and/or at least one layer of electromagnetic-shielding Ag alloy film, and further, if required, the underlayer, and the protective layer may be used in combination, resulting in a multilayer. Namely, the electromagnetic-shielding Ag alloy film-formed product in accordance with the present invention may be configured such that the electromagnetic-shielding Ag alloy film in accordance with the present invention is formed on a substrate. Alternatively, it may also be configured as follows. On the substrate, a film containing at least one selected from the group consisting of oxide, nitride, and oxynitride is formed as an underlayer. On the underlayer, the electromagnetic-shielding Ag alloy film in accordance with the present invention is formed. On the Ag alloy film, a film containing at least one selected from the group consisting of oxide, nitride, and oxynitride is formed as a protective layer.

For example, when the product is used for the application in which visible light transmission is required, it is recommendably formed so that the Ag alloy film or the like is on the indoor side. If the film is formed on the outdoor side, there is unpreferably a high possibility that flaws occur on the film due to external factors (such as pebbles and dust). Whereas, even if the film is set on the indoor side, flaws may occur on the film due to the external factors. For this reason, in general, the film on which the Ag alloy film or the like is formed is desirably used in such a state so as not to be directly exposed to external environment. Therefore, the Ag alloy film-formed product in accordance with the present invention may be a substrate single layer. However, it may also be a multilayer made of a combination of a plurality of substrates from the viewpoint of protecting the Ag alloy film from the external factors. The combination for the multilayer has no particular restriction. Examples of the product in the case where glass having transparency is used as a substrate may include insulating glass and laminated glass. Incidentally, considering the indoor heat insulating property, noise insulating property, and the like, required according to the living environment, the substrate is recommendably formed into an insulating glass or a laminated glass from the viewpoint of durability. The combination when the substrate is formed into an insulating glass has no particular restriction. Desirable examples of the insulating glass include the one hermetically sealed so that air layers (space layers) are disposed by using a plurality of glass plates, and disposing spacers or the like between the adjacent glass plates. In such a case, a dry air or a nitrogen gas is preferably filled in the air layers from the viewpoint of preventing the corrosion between the glass plates. Whereas, formation of the Ag alloy film on the air layer side of the outside glass or on the air layer side of the inside glass can attain the prevention of damaging during factory manufacturing, and hence it is desirable. This is also the same for the case using a transparent member other than the case using glass having transparency as a substrate. The product is recommendably formed in a multilayer structure in which the transparent member is stacked on the Ag alloy film (or a protective layer further formed on the Ag alloy film) formed on a substrate (transparent substrate) made of the transparent member. In this case, preferably, the transparent members are stacked through spacers, and a space layer is disposed between the transparent member and the underlying film (Ag alloy film or protective layer).

When the electromagnetic-shielding Ag alloy film in accordance with the present invention is used for the application in which visible light transmission is not required, the Ag alloy film may be formed inside and/or outside of each cover of equipments requiring electromagnetic shielding such as electronic equipments. Alternatively, the Ag alloy film may also be formed on any side of an electromagnetic-shielding plate. Of course, as described above, the film may be formed in a multilayer in order to protect the Ag alloy film from the external factors. An underlayer, a protective layer, and the like may also be formed according to uses. Of course, a laminated film obtained by coating the polymer film with the Ag film may be bonded on a substrate to mount the Ag film internally in or externally on equipments.

The electromagnetic-shielding Ag alloy film in accordance with the present invention is recommendably formed on the substrate by a sputtering process. When a pure Ag film is formed on the substrate by a deposition process such as a sputtering process, an island film is formed with a thickness of up to about several tens nanometers, and the surface energy of Ag is in a high state. Thus, if the Ag film is directly exposed to air, the surface energy of Ag is further raised. Therefore, it is conceivable that the aggregation of Ag becomes more likely to occur in order to reduce the surface energy. However, for the Ag alloy film to which Bi and/or Sb has been added, conceivably, the surface energy of Ag is low, so that the surface diffusion of Ag is suppressed, which allows the suppression of aggregation. In particular, conceivably, when the Bi- and/or Sb-incorporated Ag alloy film has been exposed to an atmosphere in which oxygen is present, Bi and/or Sb is diffused in the surface of Ag, and bonds to oxygen, thereby to form an oxide. This cuts off the Ag alloy film from the environment, and reduces the surface energy of Ag. Accordingly, the surface diffusion of Ag is further suppressed, which allows the suppression of aggregation. Conceivably, if one or more elements of Cu, Au, Pd, Rh, Ru, Ir, and Pt are added to the Ag alloy film, the surface energy is further reduced, so that the aggregation of Ag is still further suppressed. Whereas, as for the additive elements Bi and/or Sb in accordance with the present invention, if oxygen is contained in the substrate, the underlying film and the protective film, Bi and/or Sb is diffused and concentrated in the surface of the Ag alloy film. Accordingly, the composition of Bi and/or Sb inside the Ag alloy film becomes a low value. As a result, the electrical resistivity is reduced, resulting in very excellent electromagnetic shielding characteristics.

As the sputtering target for deposition by a sputtering process of the electromagnetic-shielding Ag alloy film, there may be used a sputtering target made of an Ag base alloy which contains at least any one of Bi: 0.2 to 23 at % and Sb: 0.01 to 10 at %, and has a Bi content and a Sb content satisfying the formula (2-1). In this case, as the sputtering target material, the Ag base alloy manufactured by a dissolution/casting process (below, also referred to as a melt-produced Ag base alloy target material) is preferably used. Such a melt-produced Ag base alloy target material is uniform in structure, and uniform in sputtering rate and outgoing angle, so that it is possible to obtain an Ag base alloy film uniform in composition with stability. As a result, it is possible to obtain a higher performance Ag alloy film-formed product. Incidentally, control of the oxygen content of the melt-produced Ag alloy target material (preferably at 100 ppm or less) makes it easy to keep the film formation rate constant, and also allows the reduction in oxygen content in the Ag base alloy film. Therefore, it is possible to enhance the corrosion resistance of the Ag alloy film.

In this case, as a sputtering target (below, also referred to as a target) for obtaining an electromagnetic-shielding Ag alloy film containing Bi and/or Sb in a total amount of 0.01 to 10.0 at %, there may be used the one made of the Ag base alloy which contains at least any one of Bi: 0.2 to 23 at % and Sb: 0.01 to 10 at %, and has a Bi content and a Sb content satisfying the formula (2-1). Incidentally, when the Ag alloy film is formed by sputtering using a target made of a Bi-containing Ag base alloy, the Bi content in the Ag alloy film is less than the Bi content in the target, and quantitatively several percent to several tens percent of the Bi content in the target. For this reason, as the target for obtaining a Bi-containing Ag alloy film, a target having a larger Bi content than the Bi content of the Ag alloy film is required to be used. More specifically, as the target for obtaining an Ag alloy film containing Bi: 0.01 to 10.0 at %, a target containing Bi: 0.2 to 23 at % is required to be used. From such a point, the target in accordance with the present invention is configured as a target of the foregoing composition. Namely, for Bi, when it is contained, there is adopted a target having a larger Bi content than the Bi content of the Ag alloy film to be obtained.

Thus, when the Ag alloy film is formed by sputtering using a target made of a Bi-containing Ag base alloy, the Bi content in the Ag alloy film is less than the Bi content in the target. This is conceivably caused by the following factors: Bi has a lower melting point than that of Ag, and the difference in melting point between Ag and Bi is large, and therefore Bi is revaporized from the top of the substrate during deposition (during sputtering); and/or Bi is difficult to sputter because the sputtering rate of Ag is larger than the sputtering rate of Bi; and/or Bi is more susceptible to oxidation than Ag, so that only Bi is oxidized on the target surface, and is not sputtered; and/or other factors.

Incidentally, as described above, the total amount of Bi and Sb contained in the Ag alloy film is required to be 0.01 at % or more and 10 at % or less. For this reason, the amounts of Bi and Sb contained in the target are also required to meet the formula (2-1). This is also caused by the difference between the Bi content in the target and the Bi content in the Ag alloy film.

Incidentally, the coefficient on the Bi content in the target (i.e., the formula of $0.000502x^3+0.00987x^2+0.0553x$ and the coefficient) in the formula (2-1) is obtained by approximation from the results of experimental examination on the correlation between the Bi content in the target and the Bi content in the Ag alloy film.

When the electromagnetic-shielding Ag alloy film in accordance with the present invention is used for electromagnetic shielding, a sputtering target is preferably used which is made of an Ag base alloy containing at least any one of Bi: 0.2 to 12 at % and Sb: 0.01 to 5 at %, and having a Bi content and a Sb content satisfying the following formula (2-2):

$0.01$ at % $\leq 0.000502x^3+0.00987x^2+0.0553x$+Sb content$\leq 5$ at %     Formula (2-2)

where, in the formula (2-2), x denotes the Bi content (at %) in the target, and Sb content denotes the Sb content (at %) in the target.

The conditions for the sputtering process has no particular restriction, and known sputtering processes may be employed.

As the infrared-shielding sputtering target, the one containing Ag as a main component, and at least any one of Bi: 0.2 to 12 at % and Sb: 0.05 to 5 at %, and having a Bi content and a Sb content satisfying the following formula (2-3) is desirable, and the one containing at least one of Bi: 0.5 to 8 at % and Sb: 0.10 to 3 at %, and having a Bi content and a Sb content satisfying the following formula (2-4) is more desirable.

$0.05$ at % $\leq 0.000502x^3+0.00987x^2+0.0553x$+Sb content$\leq 5$ at %     Formula (2-3)

$0.10$ at % $\leq 0.000502x^3+0.00987x^2+0.0553x$+Sb content$\leq 3$ at %     Formula (2-4)

where, in the formulae (2-3) and (2-4), x denotes the Bi content (at %) in the target, and Sb content denotes the Sb content (at %) in the target.

As the electromagnetic-shielding sputtering target, the one containing Ag as a main component, and at least any one of Bi: 0.2 to 12 at % and Sb: 0.01 to 5 at %, and having a Bi content and a Sb content satisfying the following formula (2-5) is desirable, the one containing at least one of Bi: 0.5 to 8 at % and Sb: 0.05 to 3 at %, and having a Bi content and a Sb content satisfying the following formula (2-6) is more preferred, and the one containing at least one of Bi: 0.5 to 5 at % and Sb: 0.10 to 1 at %, and having a Bi content and a Sb content satisfying the following formula (2-7) is further preferred.

$0.01$ at % $\leq 0.000502x^3+0.00987x^2+0.0553x$+Sb content$\leq 5$ at %     Formula (2-5)

$0.05$ at % $\leq 0.000502x^3+0.00987x^2+0.0553x$+Sb content$\leq 3$ at %     Formula (2-6)

$0.10$ at % $\leq 0.000502x^3+0.00987x^2+0.0553x$+Sb content$\leq 1$ at %     Formula (2-7)

where, in the formulae (2-5), (2-6), and (2-7), x denotes the Bi content (at %) in the target, and Sb content denotes the Sb content (at %) in the target.

If these targets are allowed to contain at least one element selected from Cu, Au, Pd, Rh, Ru, Ir, and Pt in a total amount of 0.3 at % or more, it is possible to further improve the effect of suppressing the aggregation of Ag. Incidentally, the amount of these elements (Cu, Au, Pd, Rh, Ru, Ir, and Pt) to be added is more preferably 0.5 at % or more, and further preferably 0.8 at % or more. On the other hand, the upper limit of the amount of these elements (Cu, Au, Pd, Rh, Ru, Ir, and Pt) to be added has no particular restriction. However, the upper limit is preferably 10 at %, more preferably 8 at %, and further preferably 5 at %.

The electromagnetic-shielding Ag alloy film deposited by a sputtering process using the sputtering target obtained by adding the additive elements (Bi and/or Sb, or further one or more of Cu, Au, Pd, Rh, Ru, Ir, and Pt) to Ag is excellent in electromagnetic shielding characteristics (infrared shielding property and radio wave shielding property), and excellent in visible light transmittivity, durability, weather resistance, and Ag aggregation resistance.

The electromagnetic-shielding Ag alloy film in accordance with the present invention is recommendably deposited by a sputtering process as described above. However, it may also be deposited by a physical vapor deposition process such as a vacuum deposition process or a chemical vapor deposition process such as a CVD process.

In the present invention, as described above, the Ag alloy film has a layer (below, also referred to as a Bi-/Sb-rich layer) having a larger Bi and/or Sb content than the inside of the Ag alloy film at the surface and/or interface of the Ag alloy film. The Bi-/Sb-rich layer is present at the surface and/or interface of the Ag alloy film. The Bi-/Sb-rich layer is present only at the surface of the Ag alloy film, or is present only at the interface of the Ag alloy film. Alternatively, it is present both at the surface and the interface of the Ag alloy film.

In this case, the surface of the Ag alloy film denotes the region other than the inside of the Ag alloy film, and it is not limited to only the outermost surface, or to only the outermost surface and the vicinity thereof. The region (layer) from the outermost surface to the site at a thickness (depth) of about ¼ of the Ag alloy film thickness is also included in the surface of the Ag alloy film. In such a region (layer), the Bi-/Sb-rich layer is present (in the case where the Bi-/Sb-rich layer is present in the surface of the Ag alloy film) Whereas, the interface of the Ag alloy film is, when other films or layers are disposed (stacked) on the surface of the Ag alloy film, the interface between the other films or layers and the Ag alloy film. As for the interface of the Ag alloy film, it has the same meaning as with the surface of the Ag alloy film, and it is not limited to only the interface, or only the interface and the vicinity thereof. The region (layer) from the interface to the site at a thickness (depth) of about ¼ of the Ag alloy film thickness is also included in the interface of the Ag alloy film. In such a region (layer) the Bi-/Sb-rich layer is present (in the case where the Bi-/Sb-rich layer is present in the interface of the Ag alloy film) Incidentally, the inside of the Ag alloy film denotes the region (layer) between the side at a thickness (depth) of about ¼ and the site at a thickness (depth) of about ¾ of that of the Ag alloy film from the surface or the interface of the Ag alloy film.

In the present invention, the foregoing Bi-/Sb-rich layer contains oxidized Bi and/or oxidized Sb. The Bi-/Sb-rich layer often comprises oxidized Bi and/or oxidized Sb. However, it is not limited thereto. It also covers the case where it contains oxidized Bi and/or oxidized Sb as a main component, and the case where Bi and/or Sb is also present other than oxidized Bi and/or oxidized Sb.

Then, an embodiment of a third invention will be described.

The present inventors have carried out an environmental test in which an optical reflective film (film thickness 100 nm) of Ag alone is allowed to stand for 48 hours under high temperatures and high humidities of a temperature of 80° C. and relative humidity of 90% in order to acceleratingly ascertain the phenomenon occurring when the optical reflective film has been exposed in air during manufacturing of a liquid crystal display device or when it has been exposed under high temperatures and high humidities for a long time during use after manufacturing. It has been shown that the reflectance of the optical reflective film is decreased by about 7.0% after the environmental test as compared with the reflectance (wavelength 650 nm) before the environmental test. The reduction in reflectance (below, referred to as "reduction with time in reflectance") is conceivably due to the factors such as the growth of crystal grains and the aggregation of Ag atoms as described in the foregoing description of the related art.

Under such circumstances, the present inventors have conducted a close study based on the idea that, in order to prevent the reduction with time in reflectance, and obtain high reflectance inherent in Ag, finding of an alloy component capable of removing or inhibiting the factors is important.

As a result of the study, the present inventors have found as follows. By allowing Ag to contain Bi and/or Sb (one or two elements selected from the group consisting of Bi and Sb), it is possible to suppress the aggregation of Ag and crystal grain growth while keeping the high reflectance inherent in Ag, and to inhibit the reduction with time in reflectance. This has led to the completion of the present invention.

Conventionally, a study has been made to use not only pure Ag but also an Ag base alloy as an optical reflective film. However, the finding that the aggregation of Ag atoms and the growth of crystal grains of Ag are suppressed by adding Bi and Sb to Ag as defined in the present invention is not observable in the related art. As for the suppression of the aggregation of Ag atoms and the crystal grain growth of Ag, there is the invention of an optical reflective film comprising an Ag base alloy to which rare earth elements have been added (JP-B No. 01729/2002) by the present inventors. However, the optical reflective film comprising a Bi- and Sb-containing Ag base alloy in the present invention has higher reflectance and durability.

In the present invention, by using an Ag base alloy containing Bi and/or Sb as an optical reflective film, the reduction with time in reflectance is suppressed, so that high optical reflectance is kept. Therefore, the present invention is based on the technical idea distinctly distinguishable from the related art. Incidentally, as described later, an alloy obtained by adding low-cost rare earth elements such as Nd and Y to an Ag base alloy containing Bi and/or Sb is also usable. Further, ternary, or quaternary or more alloys containing Au, Cu, Pt, Pd, and Rh which are the components for improving the oxidation resistance are also usable. Below, the present invention will be described in details.

In the present invention, in view of the point that the optical reflective film for use in, for example, a reflective type liquid crystal display device or the like is required to have reflection characteristics of a visible light, the reflectance was measured at a wavelength of 650 nm to study the reflection characteristics. Incidentally, in the following description, "initial reflectance (%)" denotes the reflectance (%) immediately after formation of the optical reflective film. The magnitude of the value is dependent upon the kind and the amount of the alloy element. Whereas, "the amount of change with time of reflectance (%)" is defined as "reflectance after environmental test (%)–initial reflectance (%)". When the amount of change with time (%) is minus, it is meant that the reflectance after environmental test is reduced than the initial reflectance.

If the optical reflective film is formed of an Ag base alloy containing Bi and/or Sb, the growth of crystal grains of Ag and the aggregation of Ag atoms are suppressed. In particular, the thin film formed by a sputtering process contains a large number of defects such as atom voids. Accordingly, Ag atoms tend to move/are diffused. Conceivably, this results in aggregation of Ag atoms. The presence of Bi and Sb in the crystal of Ag suppresses the movement/diffusion of Ag atoms. Conceivably, this results in suppression of crystal grain growth of Ag and the aggregation of Ag atoms.

By adding Bi and/or Sb in a total amount of 0.01 at % or more, the effects of suppressing the growth of crystal grains of Ag and the aggregation of Ag atoms are produced. However, the reduction in initial reflectance or the increase in electrical resistivity is entailed with an increase in amount of these elements to be added. Therefore, the total amount of Bi and/or Sb to be added is preferably set at 4 at % or less. In particular, when a liquid crystal display device serves as both a reflector and an electrode, the electrical resistivity is desirably set as low as possible. Namely, as for the initial reflectance, if the total amount of Bi and/or Sb to be added is set within 2 at %, it is possible to keep a high initial reflectance of 80% or more. On the other hand, as for the electrical resistivity, in general, the electrical resistivity of an Al alloy (such as Al—Ta or Al—Nd) to be used as a wiring film of the liquid crystal display device is about 5 to 15 µΩcm. For this reason, if the amount of both Bi and Sb is set within 1.8 at % as shown in examples described later, it is possible to obtain an electrical resistivity of not more than 15 µΩcm equal to that of an Al alloy wiring. However, for a refractory metal of high melting point such as Cr or Mo to be used for the liquid crystal display device wiring film as with the Al alloy, it is used with an electrical resistivity up to about 200 µΩcm. Accordingly, even when the amount of Bi and Sb to be added exceeds 1.8 at %, the film is usable without a problem. Therefore, the more preferred upper limit of the total amount of Bi and/or Sb is 2 at %.

On the other hand, as an environmental test for acceleratingly reproducing the environment in which the crystal grain growth of Ag and the aggregation of Ag atoms tend to occur, the optical reflective film was allowed to stand for 48 hours under a high-temperature high-humidity environment of a temperature of 80° C. and a relative humidity of 90%. Even in this case, if Bi and/or Sb is present in a total amount of 0.05 at % or more, it is possible to control the difference between the reflectance before the environmental test [=initial reflectance] (%) and the reflectance (%) after the environmental test to 1% or less. Accordingly, the more preferred lower limit of the total amount of Bi and/or Sb is 0.05 at %.

In the Ag base alloy to be used for the formation of the optical reflective film of the present invention, further, rare earth elements, particularly Nd and/or Y may also be contained. This is due to the following facts. Nd and Y also have an effect of improving the aggregation resistance of Ag although they produce a smaller effect as compared with Bi and Sb described above. In addition, Nd and Y require a lower material cost as compared with Bi and Sb. Therefore, replacement of a part of Bi and Sb therewith allows the cost reduction. Incidentally, the total amount of Nd and/or Y to be added is preferably set at 0.01 at % or more. However, the addition of Nd and Y entails the reductions in initial reflectance and electrical resistivity. Therefore, the total amount thereof is set at preferably 2 at % or less, and more preferably 1 at % or less. (Incidentally, even if only Nd and/or Y is added to Ag without adding Bi and/or Sb thereto, it is possible to improve the aggregation resistance of Ag, but a problem is encountered that the NaCl resistance is not improved as described in the following examples).

Au, Cu, Pt, Pd, Rh, and the like may also be added for the purpose of improving the oxidation resistance. These elements do not have an effect of suppressing the aggregation of Ag, but they have an effect of increasing the chemical stability, and have a function of inhibiting the reduction with time in reflectance. Incidentally, these elements entails a reduction in reflectance particularly in a short wavelength region (around 400 nm) with an increase in amount added. For this reason, the total amount is set at preferably 3 at % or less, and more preferably 2 at % or less.

An preferred embodiment for obtaining a high initial reflectance is such that the optical reflective film of the present invention contains Bi and/or Sb, and if required, contains Nd and Y, or Cu, Au, Pd, Rh, and Pt, with the balance being substantially Ag. However, other components than the foregoing components may also be added so long as they are added in such a range as not to impair the function of the present invention. For example, Zn, Ti, Mg, Ni, and the like may also be added from the viewpoints of chemical corrosion and reaction prevention. Whereas, gas components such as Ar, $O_2$, and $N_2$, and impurities contained in the Ag base alloy which is a molten raw material are also allowable.

The optical reflective film of the present invention can keep high reflectance for a long time, and hence it is preferably used for a reflection type liquid crystal display device. Further, the optical reflective film of the present invention is excellent in resistance to the structural changes such as the crystal grain growth during heating. Therefore, it is particularly suitable for a liquid crystal-display device which goes through a heating step of generally 200 to 300° C. during manufacturing steps. Further, the optical reflective film has a conductivity, and hence it is available as a reflection electrode of a reflection type liquid crystal display device. Alternatively, it may also be disposed as a reflector on the back of a transparent electrode. As the electrode substrates when the optical reflective film is used as a reflection electrode, known ones such as a glass substrate and a plastic film substrate are available. The same ones are also available for the base materials of the reflectors. Further, the optical reflective film can be used in such a manner as to also serve as a wiring film.

A sputtering process is preferably used for forming the optical reflective film on the substrate or the base material. Bi and Sb have a very low solubility limit with respect to Ag in a chemical equilibrium state. However, for the thin film formed by a sputtering process, non-equilibrium solid solution becomes possible by vapor phase quenching inherent in a sputtering process. Therefore, as compared with the case where an Ag base alloy thin film is formed by other thin film formation process, the foregoing alloy elements tend to be uniformly present in the Ag matrix. As a result, the oxidation resistance of the Ag base alloy is improved, and the suppression effect against the aggregation of Ag atoms is exerted.

The film thickness of the optical reflective film is preferably 50 to 300 nm. For a thin film with a thickness of less than 50 nm, light starts to transmit therethrough, and hence the reflectance is reduced. On the other hand, when the thickness exceeds 300 nm, there is no problem for reflectance, but disadvantages occur in terms of productivity and cost.

For sputtering, as a sputtering target (below, also simply referred to as a "target"), the Ag base alloy which contains one or two elements selected from the group consisting of Bi: 0.2 to 15 at % and Sb: 0.01 to 4 at %, and has a Bi content and a Sb content in the sputtering target satisfying the following reshown formula (3-1) is used. As a result, it is possible to obtain an optical reflective film of a desirable chemical composition.

$$0.01 \leq 0.000502 nBi^3 + 0.00987 nBi^2 + 0.0553 nBi + nSb \leq 4 \quad (3\text{-}1)$$

Where, in the formula (3-1), nBi denotes the Bi content (at %) in the Ag alloy sputtering target, and nSb denotes the Sb content (at %) in the Ag alloy sputtering target; and at % denotes atom %.

Herein, the reason for setting the content of Bi in the optical reflective film higher than the content of Bi in the target is as follows. Namely, when an optical reflective film is formed by a sputtering process using a target made of a Bi-containing Ag base alloy, it is observed that the Bi content in the optical reflective film is reduced to several percent to several tens percent of the Bi content in the target. This is conceivably caused by the following factors: Bi is revaporized from the top of the substrate during deposition because of a large difference in melting point between Ag and Bi; Bi is difficult to sputter because the sputtering rate of Ag is higher than the sputtering rate of Bi; only Bi is oxidized on the target surface because Bi is more susceptible to oxidation than Ag, and is not sputtered; and other factors. The phenomenon that the element content in the optical reflective film is largely reduced from the element content in the target in this manner is the phenomenon not observable for other Ag base alloys such as Ag—Sb alloy and Ag-rare earth metal alloy. For this reason, the Bi content in the target is required to be set higher than the Bi content in the objective optical reflective film. For example, in order to obtain an optical reflective film containing Bi in an amount of 0.005 to 0.4 at % the Bi content in the target is required to be set at 0.15 to 4.5 at % in consideration of the content of Bi which will not be incorporated into the optical reflective film (see Example 4 described later). Incidentally, as described previously, the total amount of Bi and Sb contained in the optical reflective film is required to be set at 0.01 to 4 at %. For this reason, the Bi content and the Sb content in the target is required to satisfy the foregoing numerical value range, and satisfy the formula (3-1).

Herein, the value of each coefficient on nBi in the formula (3-1) is obtained by approximation from the results of experimental examination on the correlation between the Bi content in the target and the Bi content in the optical reflective film.

As a target, the Ag base alloy (melt-produced Ag base alloy) manufactured by a dissolution/casting process is preferably used. The melt-produced Ag base alloy is uniform in structure, and the sputtering rate and the outgoing angle can be set constant, so that it is possible to obtain an optical reflective film uniform in composition. If the oxygen content of the melt-produced Ag base alloy target is controlled at 100 ppm or less, it becomes easy to keep the film formation rate constant, and the oxygen content in the optical reflective film also becomes lower. Therefore, the reflectance and the electrical resistivity are improved.

The reflection type liquid crystal display device of the present invention may properly include the optical reflective film of the present invention, and has no other particular restriction as to the constitution as a liquid crystal display device. All known constitutions in the field of a liquid crystal display device are adoptable.

Below, the present invention will be described in more details by way of examples. However, the following examples should not be construed as limiting the scope of the invention. All of modifications or changes practiced within a scope not departing from the spirit of the present invention are included in the technical range of the present invention.

EXAMPLE 1

First, the measurement and evaluation method of each characteristic will be described below.

[Manufacturing of Ag Base Alloy Thin Film]

Using composite targets each formed by locating chips of various additive elements on a pure Ag sputtering target, each thin film of pure Ag (sample No. 1), Ag—Bi alloys (sample Nos. 2 to 5), Ag—Sb alloys (sample Nos. 6-9), Ag—Bi—Nd alloys (sample Nos. 10 to 14), Ag—Bi—Y alloys (sample Nos. 15-19), Ag—Sb—Nd alloys (sample Nos. 20 to 24), Ag—Sb—Y alloys (sample Nos. 25 to 29), Ag—Bi—Cu alloys (sample Nos. 30 to 34), Ag—Bi—Au alloys (sample Nos. 35 to 39), Ag—Sb—Cu alloys (sample Nos. 40 to 44), Ag—Sb—Au alloys (sample Nos. 45 to 49), Ag—Bi—Nd—Cu alloy (sample No. 50), Ag—Bi—Nd—Au alloy (sample No. 51), Ag—Bi—Y—Cu alloy (sample No. 52), Ag—Bi—Y—Au alloy (sample No. 53), Ag—Sb—Nd—Cu alloy (sample No. 54), Ag—Sb—Nd—Au alloy (sample No. 55), Ag—Sb—Y—Cu alloy (sample No. 56), Ag—Sb—Y—Au alloy (sample No. 57), Ag—Si alloy (sample No. 58), and Ag—Sn alloy (sample No. 59), with a film thickness of 100 nm (as a reflective film), or 15 nm (as a semi-transmissive reflective film) was deposited on a polycarbonate substrate (diameter: 50 mm, thickness: 1 mm) with a DC magnetron sputtering process. Then, each composition of these Ag base alloy thin films were examined by an ICP (inductively coupled plasma) mass spectroscopy.

Then, using each Ag base alloy thin film manufactured, the characteristics (thermal conductivity, reflectance, and durability) as a reflective film (film thickness 100 nm) or a semi-transmissive reflective film (15 nm) were examined. In particular, as for the thermal stability out of the durabilities, the changes in reflectance before and after a high-temperature high-humidity test, surface roughness (average roughness), crystal grain diameter, and the like were examined. As for the chemical stability out of the durabilities, the changes in appearance after a salt immersion test were examined. Thus, the durabilities of each thin film were evaluated.

Example 1-1

Measurement of Thermal Conductivity

The thermal conductivity of each thin film with a thickness of 100 nm manufactured as described above was measured in the following manner. The sheet resistance Rs was measured with a four probe method by means of 3226-mΩ Hi TESTER manufactured by HIOKI Co, and the film thickness t was measured by means of alpha-step 250 manufactured by TENCOR INSTRUMENTS Co. Then, the electrical resistivity σ(=sheet resistance Rs×film thickness t) was calculated, and then, the thermal conductivity κ(=2.51×absolute temperature T/electrical resistivity σ) at an absolute temperature of 300 K (≈27° C.) was calculated by the law of Wiedemann-Franz. Incidentally, for the evaluation, the one showing 256 W/(m·K) or more, which corresponds to 80 percent or more of the thermal conductivity: 320 W/(m·K) of a pure Ag thin film has been judged as having high thermal conductivity. The results are shown in Tables 1 and 2.

As apparent from Tables 1 and 2, any of the pure Ag thin film (sample No. 1), the Ag—Si alloy (sample No. 58) thin film, and the Ag base alloy thin films of sample Nos. 2 to 4, 6 to 8, 10 to 13, 15 to 18, 20 to 23, 25 to 28, 30 to 33, 35 to 38, 40 to 43, 45 to 48, and 50 to 57, which satisfy the defined requirements of the present invention has high thermal conductivity. In contrast, for the Ag base alloy thin films of sample Nos. 5, 9, 14, 19, 24, 29, 34, 39, 44, and 49, it is not possible to obtain a prescribed high thermal conductivity because of the too large amount of the alloy elements to be added. Whereas, also for the thin film of the Ag—Sn alloy (sample No. 59), it is not possible to obtain high thermal conductivity. Incidentally, the addition effects of Rh, Pd, and Pt are the same as the addition effects of Cu or Au.

[see Tables 1, 2]

Example 1-2

Measurement of Reflectance

The reflectance with respect to a visible light (wavelength: 400 to 800 nm) of each thin film with a thickness of 100 nm manufactured in the foregoing manner was measured by means of Polar Kerr Scope NEO ARK MODEL BH-810 manufactured by Nihon Kagaku Engineering Co. Incidentally, for the evaluation of high reflectance, the one showing 80% or more (wavelength 405 nm) and 88% or more (wavelength 650 nm) relative to 90.8% (wavelength 405 nm) and 92.5% (wavelength 650 nm), respectively, which are the reflectances of the pure Ag thin film has been judged as having a high reflectance. Herein, the wavelength of 405 nm is the wavelength of a laser light to be used for a next-generation optical disk, and the wavelength of 650 nm is the wavelength of a laser light to be used for a DVD. The results are shown in Tables 3 and 4.

As apparent from Tables 3 and 4, any of the pure Ag thin film (sample No. 1), the thin films of the Ag—Si alloy (sample No. 58) and the Ag—Sn alloy (sample No. 59), and the Ag base alloy thin films of sample Nos. 2 to 4, 6 to 8, 10 to 13, 15 to 18, 20 to 23, 25 to 28, 30 to 33, 35 to 38, 40 to 43, 45 to 48, and 50 to 57, which satisfy the defined requirements of the present invention has high thermal conductivity. In contrast, for the Ag base alloy thin films of sample Nos. 5, 9, 14, 19, 24, 29, 34, 39, 44, and 49, it is not possible to obtain a prescribed high reflectance because of the too large amount of the alloy elements to be added. Incidentally, the addition effects of Rh, Pd, and Pt are the same as the addition effects of Cu or Au.

[see Tables 3, 4]

Example 1-3

Durability Test 1: Evaluation of Thermal Stability

Each of the same 100 nm-thick thin films as those used for the measurement of the reflectance of Example 2 was subjected to a high-temperature high-humidity test (temperature 80° C.–humidity 90% RH–retention time 48 hours). After the test, the reflectance was measured again. For the evaluation, the one showing absolute values of the changes in reflectance before and after the high-temperature high-humidity test of 5% or less (wavelength 405 nm) and 1% or less (wavelength 650 nm) has been judged as having high durability. The results are shown in Tables 5 and 6.

As apparent from Tables 5 and 6, any of the Ag base alloy thin films of the sample Nos. 2 to 57 satisfying the defined requirements of the present invention has high durability. In contrast, for the thin films of the pure Ag (sample No. 1) the Ag—Si alloy (sample No. 58), and the Ag—Sn alloy (sample No. 59), it is not possible to obtain a prescribed high durability. Incidentally, the addition effects of Rh, Pd, and Pt are the same as the addition effects of Cu or Au.

[see Tables 5, 6]

Example 1-4

Durability Test 2: Evaluation of Chemical Stability

Each of the 15 nm-thick thin films manufactured in the foregoing manner was subjected to a salt immersion test (salt water concentration: 0.05 mol/l for NaCl, salt water temperature: 20° C., immersion time: 5 minutes). The changes in appearance of the thin film after the test were visually observed. For the evaluation, the one of which the changes in appearance such as discoloration and peeling were not observed have been judged as having high durability. The results are shown in Tables 7 and 8.

As apparent from Tables 7 and 8, any of the Ag base alloy thin films of the sample Nos. 2 to 57 satisfying the defined requirements of the present invention has high durability. In contrast, for the thin films of the pure Ag (sample No. 1), the Ag—Si alloy (sample No. 58), and the Ag—Sn alloy (sample No. 59), it is not possible to obtain a prescribed high durability. Incidentally, the addition effects of Rh, Pd, and Pt are the same as the addition effects of Cu or Au.

[see Tables 7, 8]

Example 1-5

Durability Test 3: Evaluation of Thermal Stability

For each of the 100 nm-thick thin films manufactured in the foregoing manner, the surface morphology observation and the surface roughness (average roughness: Ra) measurement were carried out by means of Nanoscope IIIa scanning probe microscope manufactured by Digital Instruments Co., in AFM: atomic force microscope mode. Then, a high-temperature high-humidity test (temperature 80° C.–humidity 90% RH–retention time 48 hours) was performed on each thin film subjected to the AFM mode measurement. After the test, the surface morphology observation and the surface roughness (average roughness: Ra) measurement were carried out again. For the evaluation, the one which showed a surface roughness of less than 1 nm both before and after the high-temperature high-humidity test have been judged as having high durability. The results are shown Tables 9 and 10.

As apparent from Tables 9 and 10, any of the Ag base alloy thin films of the sample Nos. 2 to 57 satisfying the defined requirements of the present invention has high durability. In contrast, for the thin films of the pure Ag (sample No. 1), the Ag—Si alloy (sample No. 58), and the Ag—Sn alloy (sample No. 59), it is not possible to obtain a prescribed high durability. Incidentally, the addition effects of Rh, Pd, and Pt are the same as the addition effects of Cu or Au.

[see Tables 9, 10]

As apparent from the results of Tables 1 to 10 shown above, the Ag base alloy thin films of the samples 2 to 4, 6 to 8, 10 to 13, 15 to 18, 20 to 23, 25 to 28, 30 to 33, 35 to 38, 40 to 43, 45 to 48, and 50 to 57, which satisfy the defined requirements of the present invention, have high performances in terms of all of high thermal conductivity, high reflectance, and high durability. In particular, the ones (sample Nos. 10 to 14) obtained by adding Nd as a rare earth metal element to the Ag—Bi alloy (sample No. 3), the ones (sample Nos. 15 to 19) obtained by adding Y thereto, or the ones (sample Nos. 30 to 34) obtained by adding Cu thereto, and the ones (sample Nos. 35 to 39) obtained by adding Au thereto have an improved durability as compared with the Ag—Bi alloy (sample No. 3). Similarly, the ones (sample Nos. 20 to 24) obtained by adding Nd as a rare earth metal element to the Ag—Sb alloy (sample No. 7), the ones (sample Nos. 25 to 29) obtained by adding Y thereto, or the ones (sample Nos. 40 to 44) obtained by adding Cu thereto, and the ones (sample Nos. 45 to 49) obtained by adding Au thereto have an improved durability as compared with the Ag—Sb alloy (sample No. 7). Further, the one (sample No. 50) obtained by adding Nd and Cu to the Ag—Bi alloy (sample No. 3), the one (sample No. 51) obtained by adding Nd and Au thereto, the one (sample No. 52) obtained by adding Y and Cu thereto, and the one (sample No. 53) obtained by adding Y and Au thereto have a still further improved durability as compared with the Ag—Bi alloy (sample No. 3). Similarly, the one (sample No. 54) obtained by adding Nd and Cu to the Ag—Sb alloy (sample No. 7), the one (sample No. 55) obtained by adding Nd and Au thereto, the one (sample No. 56) obtained by adding Y and Cu thereto, and the one (sample No. 57) obtained by adding Y and Au thereto have a still further improved durability as compared with the Ag—Sb alloy (sample No. 7).

EXAMPLE 2

Example 2-1

Using a sputtering target containing Ti as a main component, a titanium oxide film (film thickness: 30 nm) was deposited as an underlayer on a transparent substrate (colorless float glass, board thickness: 3 mm, size: 2 cm×4 cm) by a sputtering process (under an atmosphere of a mixed gas of Ar and oxygen). The resulting plate was used as a substrate for each test.

With a sputtering process (under an Ar gas atmosphere) using the substrate, an Ag alloy film (electromagnetic-shielding Ag alloy film) of each composition shown in Table 12 was deposited on the underlayer (titanium oxide film) of the substrate while controlling the film thickness to be about 10 nm.

At this step, as the sputtering target, the composite target formed by locating 5×5 mm plate-like chips (comprising alloy components such as Bi) on a pure Ag target was used.

After the deposition of the Ag alloy film (and the pure Ag film), using a sputtering target containing Ti as a main component, again, a titanium oxide (film thickness: 20 nm) was deposited as a protective layer on the Ag alloy film by a sputtering process (under an atmosphere of a mixed gas of Ar and oxygen). This resulted in electromagnetic-shielding Ag alloy film-formed products in each of which a film of a three-layered structure of titanium oxide/Ag alloy film/titanium oxide had been formed on the transparent substrate.

On the other hand, in order to examine the composition of each Ag alloy film, only an Ag alloy film was formed on a float glass with a sputtering process under the same conditions as those for the deposition of the foregoing Ag alloy film using the composite target for the deposition of the Ag alloy film. Then, the composition of each film was determined by an ICP process.

Whereas, for each electromagnetic-shielding Ag alloy film-formed product obtained by the deposition, the sheet resistance value (electrical resistance value) and the visible light transmittance were measured. Further, a high-temperature high-humidity test [allowed to stand for 48 hours under an atmosphere at 85° C. and 95% Rh (relative humidity)] was carried out. Then, the occurrence or non-occurrence of aggregation of Ag was examined, and the sheet resistance value was also measured. At this step, the sheet resistance value was determined by a four probe method. The aggregation of Ag was examined by the naked eye and by means of an optical microscope observation (magnification: 200 times). The visible transmittance was measured based on the method defined in JIS R3106.

Further, for the Ag alloy film-formed products, a salt immersion test (NaCl concentration: 0.05 mol/liter, immersion time: 15 minutes) was carried out. The states of discoloration/peeling were visually observed.

The results of the test and the like are shown together with the compositions of the Ag alloy films in Table 10.

Comparative Example 2-1

Ag alloy film-formed products in each of which a film of a three-layered structure of titanium oxide/Ag alloy film/titanium oxide had been formed on a transparent substrate were obtained in the same manner and under the same conditions as with Example 2-1. Incidentally, the compositions of the Ag alloy films are different from those of Example 2-1, and as shown in Table 2. Namely, the alloy component is any one of Nd, In, Nb, Sn, Cu, Al and Zn. Further, the deposition of a pure Ag film was also carried out using only a pure Ag target to also manufacture a pure Ag film-formed product in which a film of a three-layered structure of titanium oxide/pure Ag film/titanium oxide had been formed on a transparent substrate (Table 11).

For the Ag alloy film-formed products and the pure Ag film-formed product, the same tests were carried out in the same manner as with Examples. Further, in the same manner as with Examples, only an Ag alloy film was formed on each float glass to determine the composition of each film with an ICP method.

The results of the tests and the like are shown together with the compositions of the Ag alloy films in Tables 12 and 11.

Results of Example 2-1 and Comparative Example 2-1

The electromagnetic-shielding Ag alloy film-formed products in accordance with the test Nos. 17 (Ag—In), 18 (Ag—Nb), 20 (Ag—Cu), 21 (Ag—Al), and 22 (Ag—Zn) are in accordance with Comparative Example 2-1. Whereas, the one in accordance with the test No. 1 is the pure Ag film-formed product (Ag film composition: pure Ag), and is in accordance with Comparative Example 2-1. In these Ag alloy film-formed products and the pure Ag film-formed product, a large number of white points were observable by the naked eye on the transparent substrate (glass) surface after the high-temperature high-humidity test. The aggregation of Ag was observed (indicated with x in Tables 12 and 11).

In contrast, in the electromagnetic-shielding Ag alloy film-formed products of the test Nos. 2 to 16 in accordance with Example 2-1 of the present invention, no white point was observed by the naked eye after the high-temperature high-humidity test. Further, the products were observed by an optical microscope with a magnification of 200 times. As a result, in the Ag alloy film-formed products in accordance with the test No. 2, No. 3, and No. 9, in each of which the Bi and/or Sb content in the Ag alloy film was less than 0.04 at %, out of the foregoing Ag alloy film-formed products, 15 to 25 white points were observed (indicated with Δ in Table 11). However, in the Ag alloy film-formed products in each of which the other alloy element (additive element) content in the layer: 0.05 at % or more, ten or less white points were observed (indicated with ○ in Table 11).

On the other hand, there have been shown the tendencies that the sheet resistance (electrical resistance) increases, and simultaneously the visible light transmittance decreases with an increase in the amount of Bi and Sb to added. In general, the electromagnetic-shielding Ag alloy film-formed product glass preferably has a visible light transmittance of roughly 50% or more from the viewpoint of ensuring the visibility and viewability. Further, in general, for ensuring the infrared-shielding property, a sheet resistance value of roughly 40 Ω/□ suffices. However, the sheet resistance value upper limit for ensuring the electromagnetic shielding property is roughly 30 Ω/□. (The sheet resistance value is obtained by dividing the resistivity (Ω·m) by the film thickness, and hence the physical unit is expressed as Ω. Herein, /□ is appended after Ω, meaning that it represents the film resistance. Also hereinafter, the film resistance is expressed as Ω/□.)

Therefore, Table 11 indicates as follows. The amount of Bi and Sb to be added may properly be 10 at % or less from the viewpoint of ensuring the infrared shielding property. Whereas, the amount of Bi and Sb to be added may properly be roughly 5 at % or less from the viewpoint of ensuring the electromagnetic shielding property.

Further, the sheet resistance value of each Ag alloy film-formed product was measured after the high-temperature high-humidity test. As a result, for the Ag alloy film-formed product of the test No. 1 in accordance with Comparative Example 2-1, the sheet resistance value largely increased by the high-temperature high-humidity test. Whereas, for the Ag alloy film-formed products of the test Nos. 2 to 15 in accordance with Example 1 of the present invention, the sheet resistance values less increased, and all were roughly 40 Ω/□ or less.

Further, in the salt immersion test, the Ag alloy film-formed product (Ag alloy film composition: Ag—Nd) of the test No. 16 in accordance with Comparative Example 2-1, judged as favorable (indicated with ○ in Table 12) in the high-temperature high-humidity test underwent discoloration (indicated with x in Table 12), and peeling. In contrast, for the Ag alloy film-formed products (Ag alloy film composition: containing Bi or Sb) of the test Nos. 2 to 15 in accordance with Example 2-1 of the present invention, less discoloration occurred (indicated with Δ and ○ in Table 11). Out of these, particularly for Bi or Sb: 0.05 at % or more, no discoloration was observed at all (indicated with ○ in Table 11). Whereas, all the Ag alloy film-formed product in accordance with Example 2-1 of the present invention underwent no peeling.

Example 2-2

Using a target containing Al (aluminum) as a main component, an aluminum oxide film (film thickness: 20 nm) was deposited as an underlayer on a transparent substrate (colorless float glass, board thickness: 3 mm, size: 2 cm×4 cm) by a sputtering process (under an atmosphere of a mixed gas of Ar and oxygen). The resulting plate was used as a substrate for each test.

With a sputtering process (under an Ar gas atmosphere) using the substrate, an Ag alloy film (electromagnetic-shielding Ag alloy film) of each composition shown in Table 13 was deposited on the underlayer (aluminum oxide film) of the substrate while controlling the film thickness to be about 15 nm. At this step, as the sputtering target, the composite target formed by locating 5×5 mm plate-like chips (comprising Bi, Au, Cu, or Pd) on a melt-produced target of the composition of pure Ag, Ag-0.2 at % Sb, or Ag-1.0 at % Sb (produced by vacuum dissolution process) was used.

After the deposition of the Ag alloy film (and the pure Ag film), by a sputtering process (under an atmosphere of a mixed gas of Ar and oxygen) using a sputtering target containing Al as a main component, again, an aluminum oxide film (film thickness: 40 nm) was deposited as a protective layer on the Ag alloy film. This resulted in electromagnetic-shielding Ag alloy-formed products in each of which a film of a three-layered structure of aluminum oxide/Ag alloy film/aluminum oxide had been formed on the transparent substrate.

On the other hand, in order to examine the composition of each Ag alloy film, only an Ag alloy film was formed on a float glass with a sputtering process under the same conditions as those for the deposition of the foregoing Ag alloy film using the composite target for the deposition of the Ag alloy film. Then, the composition of each film was determined by an ICP process.

Whereas, for each electromagnetic-shielding Ag alloy film-formed product obtained by the deposition, the sheet resistance value (electrical resistance value) and the visible light transmittance were measured. Further, a high-temperature high-humidity test [allowed to stand for 240 hours under an atmosphere at 85° C. and 95% Rh] was carried out. Then, the glass surface was magnified to 10 times through a projector to count the number of aggregation points (white points) of Ag. Whereas, the sheet resistance value was also measured. At this step, the sheet resistance value was determined by a four probe method. The visible transmittance was measured based on the method defined in JIS R3106.

The results of the test and the like are shown together with the compositions of the Ag alloy films in Table 13.

Comparative Example 2-2

The same pure Ag film-formed product as with the test No. 1 in accordance with Comparative Example 2-1 was manufactured. For this, the same test as for Example 2-2 was carried out. The results are shown in Table 13.

Results of Example 2-2 and Comparative Example 2-2

The one for the test No. 23 is the pure Ag film-formed product (Ag film composition: pure Ag), and is in accordance with Comparative Example 2-2. In the pure Ag film-formed product, the occurrence of a large number of white points (aggregation points of Ag) was observable by the naked eye after the high-temperature high-humidity test. Further, the sheet resistance value was largely increased by the high-temperature high-humidity test.

In contrast, for the electromagnetic-shielding Ag alloy film-formed product (Ag alloy film composition: Ag-0.19 at %) of the test No. 24, the number of white points (aggregation points of Ag) occurred was about 10, and very small. Whereas, almost no increase in sheet resistance value due to the high-temperature high-humidity test was observable.

The electromagnetic-shielding Ag alloy film-formed products (Ag alloy film composition: Ag—Bi, or Sb—Au, Cu, or Pd) of the test Nos. 25 to 34 are in accordance with Example 2-2 of the present invention. Table 13 indicates as follows. As for these Ag alloy film-formed products, the number of white points (aggregation points of Ag) occurred is smaller than with the Ag alloy film-formed product of the test No. 24, and the number of white points occurred decreases with an increase in amount of Au, Cu, or Pd to be added.

Incidentally, in Examples 2-1 and 2-2 described above, Bi and Sb are each singly added. However, also when they are added at the same time, the results of the same tendencies as with Examples 2-1 and 2-2 are obtainable. Whereas, in Example 2-2, for Cu, Au, Pd, Rh, Ru, Ir, and Pt, Au, Cu, and Pd are each singly added. However, also when these are simultaneously added, the results of the same tendencies as with Example 2 are obtainable. Whereas, also both in the case where elements (Rh, Ru, Ir, and Pt) other than Au, Cu, and Pd are each singly added, and in the case where these are simultaneously added, the results of the same tendencies as with Example 2 are obtainable.

Example 2-3, Comparative Example 2-3

Using a target containing ITO as a main component, an ITO film was deposited with a thickness of 40 nm on a 70 μm-thick polyethylene terephthalate (PET) film by a high-frequency sputtering process (under an Ar gas atmosphere). Then, using an Ag-0.5 at % Bi target (below, referred to as 0.5 Bi-T), an Ag—Bi alloy film was deposited with a thickness of 15 nm. Further, another ITO film was deposited with a thickness of 40 nm by a sputtering process. The multilayered film [below, referred to as a three-layered film of ITO/Ag—Bi alloy film (using 0.5Bi-T, film thickness 15 nm)/ITO] was subjected to composition analysis in the direction of film thickness by XPS while being etched from the surface by an Ar ion beam. As a result, it was observed that Bi was concentrated at the interface between the ITO film of the outermost layer (the layer most distant from the PET film) and the Ag—Bi alloy film. Further, it was observed from the narrow-range spectrum of the concentrated Bi that Bi was oxidized.

On the other hand, a multilayered film deposited using the one of a target composition of Ag-1.5 at % Bi (below, referred to as 1.5 Bi-T) for the Ag—Bi alloy film with the film thickness of each layer and the number of layers being the same as in the foregoing multilayered film, [below, referred to as a three-layered film of ITO/Ag—Bi alloy film (using 1.5Bi-T, film thickness 15 nm)/ITO], and a multilayered film deposited using the one of a target composition of Ag-2.0 at % Bi (below, referred to as 2.0 Bi-T) [below, referred to as a three-layered film of ITO/Ag—Bi alloy film (using 2.0Bi-T, film thickness 15 nm)/ITO] were also manufactured. Whereas, a multilayered film obtained by using an Ag-1 at % Pd alloy film for the Ag—Bi alloy film in the foregoing deposition, [below, referred to as a three-layered film of ITO/Ag-1% Pd alloy film (film thickness 15 m)/ITO] (the film in accordance with Comparative Example) was deposited. Further, a multilayered film obtained by setting only the thickness of the Ag—Bi alloy film deposited using 0.5Bi-T (Ag-0.5 at % Bi target) at 2 nm in the foregoing deposition [below, referred to as a three-layered film of ITO/Ag—Bi alloy film (using 0.5 Bi-T, film thickness 2 nm)/ITO] was manufactured.

As for the five kinds of films manufactured in this manner, namely, (1) Three-layered film of ITO/Ag—Bi alloy film (using 0.5 Bi-T, film thickness 15 nm)/ITO;

(2) Three-layered film of ITO/Ag—Bi alloy film (using 1.5 Bi-T, film thickness 15 nm)/ITO;

(3) Three-layered film of ITO/Ag—Bi alloy film (using 2.0 Bi-T, film thickness 15 nm)/ITO;

(4) Three-layered film of ITO/Ag-1% Pd alloy film (film thickness 15 nm)/ITO; and (5) Three-layered film of ITO/Ag—Bi alloy film (using 0.5 Bi-T, film thickness 2 nm)/ITO, these were respectively immersed in salt water with a concentration of 0.5 mol/L, to examine the aggregation degree of Ag through optical microscope observation (magnification: 200 times).

As a result, in the film of (4), i.e., the three-layered film of ITO/Ag-1% Pd alloy film (film thickness 15 nm)/ITO (the film in accordance with Comparative Example), white points indicating the aggregation of Ag started to occur on the surface in 75-hour immersion. In contrast, in the films of (1) to (3), i.e., the three-layered film of ITO/Ag—Bi alloy film (using 0.5 Bi-T, film thickness 15 nm)/ITO [the film in accordance with Example of the present invention], the three-layered film of ITO/Ag—Bi alloy film (using 1.5 Bi-T, film thickness 15 nm)/ITO [the film in accordance with Example of the present invention], and the three-layered film of ITO/Ag—Bi alloy film (using 2.0 Bi-T, film thickness 15 nm)/ITO [the film in accordance with Example of the present invention], no change was observed at all even after 150-hour immersion, and excellent salt water immersion resistance was shown. Incidentally, all of the films of (1) to (3), and the film of (4) are equal in film thickness of the alloy film (film thickness 15 nm).

As for the film of (5), i.e., the three-layered film of ITO/Ag—Bi alloy film (using 0.5 Bi-T, film thickness 2 nm)/ITO, white points indicating the aggregation of Ag started to occur on the surface in 60-hour immersion. Thus, it was inferior in salt water immersion resistance to the film of (1). This is because the thickness of the Ag—Bi alloy film is small (film thickness 2 nm). Thus, for the film of (5), the thickness of the Ag—Bi alloy film is as thin as 2 nm. Still, as compared with the film of (4) in which the thickness of the Ag-1% Pd alloy film is 15 nm, which is larger than this [three-layered film of ITO/Ag-1% Pd alloy film (film thickness 15 nm)/ITO], the length of time until when white points indicating the aggregation start to occur on the surface is roughly equal, and the salt water immersion resistance is not largely different, and roughly the same.

When the film is immersed in salt water concentration 0.5 mol/L) as described above, for the film of (5) [three-layered film of ITO/Ag—Bi alloy film (using 0.5 Bi-T, film thickness 2 nm)/ITO], white points indicating the aggregation start to occur in 60 hours. Therefore, even with the Ag—Bi alloy film, when the film thickness is as small as 2 nm, it may be impossible to obtain a desirable salt water immersion resistance. In such a case, the thickness of the Ag—Bi alloy film is desirably set at 3 nm or more.

Example 2-4, Comparative Example 2-4

On a 70 μm-thick PET (polyethylene phthalate) film, deposition was carried out in the order of ITO film/Ag—Bi alloy film/ITO film/Ag—Bi alloy film/ITO film/Ag—Bi alloy film/ITO film by a sputtering process. Thus, a multilayered film of ITO films and Ag—Bi alloy films was deposited. At this step, for manufacturing of the Ag—Bi alloy films, a target of composition of Ag-0.25 at % Bi (below, referred to as 0.25Bi-T) was used. Further, deposition was carried out so that the film thicknesses of respective layers are 20 nm for the ITO films and 10 nm for the Ag—Bi alloy films. The multilayered film [below, referred to as a seven-layered film of ITO/Ag—Bi alloy film (using 0.25Bi-T, film thickness 10 nm)] was subjected to composition analysis in the direction of film thickness by XPS while being etched from the surface by an Ar ion beam. As a result, it was observed that Bi was concentrated at the interface between the ITO film of the outermost layer (the layer most distant from the PET film) and the Ag—Bi alloy film. Further, it was observed from the narrow-range spectrum of the concentrated Bi that Bi was oxidized.

On the other hand, a multilayered film obtained by substituting an Ag-1 at % Pd-1.7 at % Cu alloy film for the portion of the Ag—Bi alloy film with the film thickness of each layer and the number of layers being the same as in the foregoing multilayered film, [below, referred to as a seven-layered film of ITO/Ag-1% Pd-1.7% Cu alloy film (film thickness 10 nm) (a film in accordance with Comparative Example) was manufactured.

As for the two kinds of films manufactured in this manner, namely, (a) Seven-layered film of ITO/Ag—Bi alloy film (using 0.25 Bi-T, film thickness 10 nm); and (b) Seven-layered film of ITO/Ag-1% Pd-1.7% Cu alloy film (film thickness 10 nm) these were respectively immersed in salt water with a concentration of 0.5 mol/L, to examine the aggregation degree of Ag through optical microscope observation (magnification: 200 times).

As a result, for the film of (b), i.e., the seven-layered film of ITO/Ag-1% Pd-1.7% Cu alloy film (film thickness 10 nm) (the film in accordance with Comparative Example), white points indicating the aggregation of Ag started to occur on the surface in 40-hour immersion. In contrast, the film of (a), i.e., the seven-layered film of ITO/Ag—Bi alloy film (using 0.25 Bi-T, film thickness 10 nm) [the film in accordance with Example of the present invention], no change was observed at all even after 100-hour immersion, and excellent salt water immersion resistance was shown. Incidentally, all of the films of (a) and (b) are equal in film thickness of the alloy film (film thickness 10 nm).

[see Tables 11-13]

Example 3-1

On a pure Ag target, 5 mm×5 mm Bi or Sb metal chips were placed. By DC magnetron sputtering, a 100 nm-thick sample of each composition shown in test Nos. 1 to 12 of Table 1 was formed on a glass plate. As for the composition of each thin film, separately, samples with a film thickness of 1 μm were manufactured under the same conditions. Thus, the identification of each composition was carried out with an ICP-mass spectrometry (SPQ-8000 manufactured by Seiko Instrument Inc.). Specifically, 100 mg or more of the sample was dissolved in a solution of sulfuric acid: pure water=1:1 as a pretreatment. The resulting solution was heated on a 200° C. hot plate, and it was checked that the sample was completely dissolved. Then, the solution was cooled and analyzed. The target size was φ100 mm, and the size of the glass substrate was φ50 mm. The main deposition conditions are as follows. Reached degree of vacuum: $6.67 \times 10^{-4}$ Pa, Ar gas pressure during deposition: 0.267 Pa, Substrate temperature: 25° C., and Distance between target-substrate: 55 mm.

Immediately after deposition, the reflectance of each sample was measured by means of a visible-UV spectrophotometer (manufactured by Shimadzu Corp.). Further, each reflectance after an environmental test (temperature 80° C., relative humidity 90%, and time 48 h) of these samples was measured by means of the spectrophotometer. Then, the amount of change in reflectance before and after the environmental test was evaluated. Further, the surface roughnesses before and after the environmental test were measured by means of an atomic force microscope (AFM). Then, the amount of change in surface roughness before and after the environmental test was evaluated. Further, a salt immersion test (NaCl: 0.05 mol/L, 15 min) was carried out. Then, the degree of discoloration of the optical reflective film and the occurrence or non-occurrence of peeling of the optical reflective film from the substrate were visually observed to evaluate the NaCl resistance.

Comparative Example 3-1

Ag alloy thin films of the compositions shown in the test Nos. 13 to 16 of Table 1 were manufactured under the same deposition conditions as with Example 3-1, except that as the metal chips to be placed on the pure Ag target, Nd, In, Nb, or Sn was used in place of Bi or Sb of Example 3-1. The same evaluations as with Example 3-1 were carried out.

The evaluation results on Example 3-1 and Comparative Example 3-1 are shown together in Table 14. As shown in Example 3-1 of Table 14, it is indicated that the amount of change in reflectance and the amount of change in surface roughness before and after the environmental test are remarkably suppressed by the addition of Bi or Sb (test Nos. 2 to 12) as compared with the pure Ag thin film (test No. 1). As for the amount of Bi or Sb to be added, even when it is 0.01 at %, the effects are observable (test Nos. 2 and 8), and particularly, when it is 0.05 at % or more, the effect is large (test Nos. 3 to 7 and 9 to 12). Further, it is indicated that, also after the salt immersion test, discoloration such as turning yellow, and peeling of the optical reflective film from the substrate are eliminated by the addition of Bi or Sb, and that favorable durabilities are shown.

In contrast, as shown in Comparative Example 3-1 of Table 14, Ag—Nd shows favorable results with respect to the suppression of the amount of change in reflectance before and after the environmental test, but has no NaCl resistance (test No. 13). Whereas, Ag—In, Ag—Nb, and Ag—Sn have very low suppression effects on the amount of change in surface roughness (test Nos. 14 to 16).

Example 3-2

Using a composite target formed by locating 5 mm×5 mm metal chips of Bi, Cu, Au, Nd, or Y on a pure Ag or Ag-0.2% Sb target, each sample was manufactured under the same deposition conditions as with Example 3-1. The same evaluations as with Example 3-1 were carried out on these samples.

The results are shown Table 15. Incidentally, the test Nos. 1 and 4 in Table 14 are reshown in Table 15 for comparison.

It is indicated that the surface roughness and the amount of change thereof are further improved by further adding Nd or Y to Ag—Bi (test Nos. 17 and 18). Whereas, it is indicated as follows. When Cu or Au is further added to Ag—Bi or Ag—Sb, the further improvement effects of the surface roughness are not produced. However, the effects of reducing the amount of change in reflectance are produced (test Nos. 19 to 24).

[see Tables 14, 15]

EXAMPLE 4

[Comparison Between the Bi Content in a Sputtering Target and the Bi Content in a Thin Film]

For comparison of the Bi content between in the sputtering target and in the thin film deposited using this, Ag base alloy thin films were deposited using the sputtering targets having the respective compositions shown in Table 16. With a sputtering process (under an Ar gas atmosphere), each Ag alloy film (Ag—Bi system alloy film) was deposited so that the film thickness was controlled to about 15 nm on a transparent substrate (colorless float glass, board thickness: 3 mm, size: 2 cm×4 cm). At this step, as the sputtering target, a melt-produced target comprising a Bi-containing Ag base alloy (manufactured by a vacuum dissolution process) was used. Incidentally, the Bi content in the melt-produced target was confirmed by measurement (analysis).

10 mg or more of the Ag base alloy portion of each thin film obtained was used as a sample, and this was dissolved in a solution of sulfuric acid:pure water=1:1. Subsequently, the resulting solution was heated on a 200° C. hot plate, and it was checked that the sample was completely dissolved. Then, the solution was cooled. Then, the amount of Bi contained in the thin film was measured by means of an ICP-mass spectrometry (SPQ-8000 manufactured by Seiko Instrument Inc.). The results are shown in Table 16.

[see Table 16]

Table 16 indicates that the Bi content in the Ag alloy film is lower than the Bi content in the sputtering target. The Bi content in the sputtering target for obtaining an Ag alloy film having a desirable Bi content is required to be determined in consideration of the relationship of the Bi content between in the sputtering target and in the thin film deposited using this.

TABLE 1

Results of thermal conductivity measurement

| Sample No. | Composition | Thermal conductivity [W/(m · K)] | High thermal conductivity |
|---|---|---|---|
| 1 | Pure Ag | 320 | ○ |
| 2 | Ag-0.005at % Bi Alloy | 319 | ○ |
| 3 | Ag-0.2at % Bi Alloy | 296 | ○ |
| 4 | Ag-0.4at % Bi Alloy | 271 | ○ |
| 5 | Ag-0.6at % Bi Alloy | 247 | x |
| 6 | Ag-0.005at % Sb Alloy | 319 | ○ |
| 7 | Ag-0.2at % Sb Alloy | 292 | ○ |
| 8 | Ag-0.4at % Sb Alloy | 264 | ○ |
| 9 | Ag-0.6at % Sb Alloy | 236 | x |
| 10 | Ag-0.2at % Bi-0.01at % Nd Alloy | 296 | ○ |
| 11 | Ag-0.2at % Bi-0.1at % Nd Alloy | 294 | ○ |
| 12 | Ag-0.2at % Bi-0.5at % Nd Alloy | 287 | ○ |
| 13 | Ag-0.2at % Bi-2at % Nd Alloy | 260 | ○ |
| 14 | Ag-0.2at % Bi-3at % Nd Alloy | 242 | x |

TABLE 1-continued

Results of thermal conductivity measurement

| Sample No. | Composition | Thermal conductivity [W/(m · K)] | High thermal conductivity |
|---|---|---|---|
| 15 | Ag-0.2at % Bi-0.01at % Y Alloy | 296 | ○ |
| 16 | Ag-0.2at % Bi-0.1at % Y Alloy | 294 | ○ |
| 17 | Ag-0.2at % Bi-0.5at % Y Alloy | 288 | ○ |
| 18 | Ag-0.2at % Bi-2at % Y Alloy | 262 | ○ |
| 19 | Ag-0.2at % Bi-3at % Y Alloy | 245 | x |
| 20 | Ag-0.2at % Sb-0.01at % Nd Alloy | 292 | ○ |
| 21 | Ag-0.2at % Sb-0.1at % Nd Alloy | 290 | ○ |
| 22 | Ag-0.2at % Sb-0.5at % Nd Alloy | 283 | ○ |
| 23 | Ag-0.2at % Sb-2at % Nd Alloy | 256 | ○ |
| 24 | Ag-0.2at % Sb-3at % Nd Alloy | 238 | x |
| 25 | Ag-0.2at % Sb-0.01at % Y Alloy | 292 | ○ |
| 26 | Ag-0.2at % Sb-0.1at % Y Alloy | 290 | ○ |
| 27 | Ag-0.2at % Sb-0.5at % Y Alloy | 284 | ○ |
| 28 | Ag-0.2at % Sb-2at % Y Alloy | 258 | ○ |
| 29 | Ag-0.2at % Sb-3at % Y Alloy | 241 | x |

TABLE 2

Results of thermal conductivity measurement

| Sample No. | Composition | Thermal conductivity [W/(m · K)] | High thermal conductivity |
|---|---|---|---|
| 1 | Pure Ag | 320 | ○ |
| 30 | Ag-0.2at % Bi-0.01at % Cu Alloy | 296 | ○ |
| 31 | Ag-0.2at % Bi-0.1at % Cu Alloy | 295 | ○ |
| 32 | Ag-0.2at % Bi-0.5at % Cu Alloy | 290 | ○ |
| 33 | Ag-0.2at % Bi-2at % Cu Alloy | 260 | ○ |
| 34 | Ag-0.2at % Bi-3at % Cu Alloy | 248 | x |
| 35 | Ag-0.2at % Bi-0.01at % Au Alloy | 296 | ○ |
| 36 | Ag-0.2at % Bi-0.1at % Au Alloy | 295 | ○ |
| 37 | Ag-0.2at % Bi-0.5at % Au Alloy | 290 | ○ |
| 38 | Ag-0.2at % Bi-2at % Au Alloy | 262 | ○ |
| 39 | Ag-0.2at % Bi-3at % Au Alloy | 251 | x |
| 40 | Ag-0.2at % Sb-0.01at % Cu Alloy | 292 | ○ |
| 41 | Ag-0.2at % Sb-0.1at % Cu Alloy | 291 | ○ |
| 42 | Ag-0.2at % Sb-0.5at % Cu Alloy | 286 | ○ |
| 43 | Ag-0.2at % Sb-2at % Cu Alloy | 256 | ○ |
| 44 | Ag-0.2at % Sb-3at % Cu Alloy | 244 | x |
| 45 | Ag-0.2at % Sb-0.01at % Au Alloy | 292 | ○ |
| 46 | Ag-0.2at % Sb-0.1at % Au Alloy | 291 | ○ |
| 47 | Ag-0.2at % Sb-0.5at % Au Alloy | 286 | ○ |
| 48 | Ag-0.2at % Sb-2at % Au Alloy | 258 | ○ |
| 49 | Ag-0.2at % Sb-3at % Au Alloy | 247 | x |
| 50 | Ag-0.2at % Bi-0.5at % Nd-0.5at % Cu Alloy | 281 | ○ |
| 51 | Ag-0.2at % Bi-0.5at % Nd-0.5at % Au Alloy | 281 | ○ |
| 52 | Ag-0.2at % Bi-0.5at % Y-0.5at % Cu Alloy | 282 | ○ |
| 53 | Ag-0.2at % Bi-0.5at % Y-0.5at % Au Alloy | 282 | ○ |
| 54 | Ag-0.2at % Sb-0.5at % Nd-0.5at % Cu Alloy | 277 | ○ |
| 55 | Ag-0.2at % Sb-0.5at % Nd-0.5at % Au Alloy | 277 | ○ |
| 56 | Ag-0.2at % Sb-0.5at % Y-0.5at % Cu Alloy | 278 | ○ |
| 57 | Ag-0.2at % Sb-0.5at % Y-0.5at % Au Alloy | 278 | ○ |
| 58 | Ag-0.2at % Si Alloy | 265 | ○ |
| 59 | Ag-0.2at % Sn Alloy | 248 | x |

TABLE 3

Results of reflectance measurement

| Sample No. | Composition | Reflectance relative to Pure Ag [%] Wavelength 405 nm | Reflectance relative to Pure Ag [%] Wavelength 650 nm | High reflectance |
|---|---|---|---|---|
| 1 | Pure Ag | 90.8 | 92.5 | ○ |
| 2 | Ag-0.005at % Bi Alloy | 90.7 | 92.5 | ○ |
| 3 | Ag-0.2at % Bi Alloy | 86.2 | 90.8 | ○ |
| 4 | Ag-0.4at % Bi Alloy | 81.6 | 89.1 | ○ |
| 5 | Ag-0.6at % Bi Alloy | 77.0 | 87.4 | x |
| 6 | Ag-0.005at % Sb Alloy | 90.7 | 92.5 | ○ |
| 7 | Ag-0.2at % Sb Alloy | 86.1 | 90.7 | ○ |
| 8 | Ag-0.4at % Sb Alloy | 81.4 | 88.9 | ○ |
| 9 | Ag-0.6at % Sb Alloy | 76.7 | 87.1 | x |
| 10 | Ag-0.2at % Bi-0.01at % Nd Alloy | 86.2 | 90.8 | ○ |

TABLE 3-continued

Results of reflectance measurement

| Sample No. | Composition | Reflectance relative to Pure Ag [%] | | High reflectance |
|---|---|---|---|---|
| | | Wavelength 405 nm | Wavelength 650 nm | |
| 11 | Ag-0.2at % Bi-0.1at % Nd Alloy | 85.9 | 90.7 | ○ |
| 12 | Ag-0.2at % Bi-0.5at % Nd Alloy | 84.8 | 90.3 | ○ |
| 13 | Ag-0.2at % Bi-2at % Nd Alloy | 80.7 | 88.6 | ○ |
| 14 | Ag-0.2at % Bi-3at % Nd Alloy | 78.0 | 87.5 | x |
| 15 | Ag-0.2at % Bi-0.01at % Y Alloy | 86.2 | 90.8 | ○ |
| 16 | Ag-0.2at % Bi-0.1at % Y Alloy | 85.9 | 90.7 | ○ |
| 17 | Ag-0.2at % Bi-0.5at % Y Alloy | 84.7 | 90.2 | ○ |
| 18 | Ag-0.2at % Bi-2at % Y Alloy | 80.3 | 88.4 | ○ |
| 19 | Ag-0.2at % Bi-3at % Y Alloy | 77.4 | 87.2 | x |
| 20 | Ag-0.2at % Sb-0.01at % Nd Alloy | 86.1 | 90.7 | ○ |
| 21 | Ag-0.2at % Sb-0.1at % Nd Alloy | 85.8 | 90.6 | ○ |
| 22 | Ag-0.2at % Sb-0.5at % Nd Alloy | 84.7 | 90.2 | ○ |
| 23 | Ag-0.2at % Sb-2at % Nd Alloy | 80.6 | 88.5 | ○ |
| 24 | Ag-0.2at % Sb-3at % Nd Alloy | 77.9 | 87.4 | x |
| 25 | Ag-0.2at % Sb-0.01at % Y Alloy | 86.1 | 90.7 | ○ |
| 26 | Ag-0.2at % Sb-0.1at % Y Alloy | 85.8 | 90.6 | ○ |
| 27 | Ag-0.2at % Sb-0.5at % Y Alloy | 84.6 | 90.1 | ○ |
| 28 | Ag-0.2at % Sb-2at % Y Alloy | 80.2 | 88.3 | ○ |
| 29 | Ag-0.2at % Sb-3at % Y Alloy | 77.3 | 87.1 | x |

TABLE 4

Results of reflectance measurement

| Sample No. | Composition | Reflectance relative to Pure Ag [%] | | High reflectance |
|---|---|---|---|---|
| | | Wavelength 405 nm | Wavelength 650 nm | |
| 1 | Pure Ag | 90.8 | 92.5 | ○ |
| 30 | Ag-0.2at % Bi-0.01at % Cu Alloy | 86.2 | 90.8 | ○ |
| 31 | Ag-0.2at % Bi-0.1at % Cu Alloy | 86.0 | 90.7 | ○ |
| 32 | Ag-0.2at % Bi-0.5at % Cu Alloy | 85.3 | 90.4 | ○ |
| 33 | Ag-0.2at % Bi-2at % Cu Alloy | 81.0 | 88.3 | ○ |
| 34 | Ag-0.2at % Bi-4at % Cu Alloy | 79.3 | 87.5 | x |
| 35 | Ag-0.2at % Bi-0.01at % Au Alloy | 86.2 | 90.8 | ○ |
| 36 | Ag-0.2at % Bi-0.1at % Au Alloy | 86.0 | 90.7 | ○ |
| 37 | Ag-0.2at % Bi-0.5at % Au Alloy | 85.4 | 90.4 | ○ |
| 38 | Ag-0.2at % Bi-3at % Au Alloy | 81.5 | 88.5 | ○ |
| 39 | Ag-0.2at % Bi-4at % Au Alloy | 79.9 | 87.7 | x |
| 40 | Ag-0.2at % Sb-0.01at % Cu Alloy | 86.1 | 90.7 | ○ |
| 41 | Ag-0.2at % Sb-0.1at % Cu Alloy | 85.9 | 90.6 | ○ |
| 42 | Ag-0.2at % Sb-0.5at % Cu Alloy | 85.2 | 90.3 | ○ |
| 43 | Ag-0.2at % Sb-3at % Cu Alloy | 80.9 | 88.2 | ○ |
| 44 | Ag-0.2at % Sb-4at % Cu Alloy | 79.2 | 87.4 | x |
| 45 | Ag-0.2at % Sb-0.01at % Au Alloy | 86.1 | 90.7 | ○ |
| 46 | Ag-0.2at % Sb-0.1at % Au Alloy | 85.9 | 90.6 | ○ |
| 47 | Ag-0.2at % Sb-0.5at % Au Alloy | 85.3 | 90.3 | ○ |
| 48 | Ag-0.2at % Sb-3at % Au Alloy | 81.4 | 88.4 | ○ |
| 49 | Ag-0.2at % Sb-4at % Au Alloy | 79.8 | 87.6 | x |
| 50 | Ag-0.2at % Bi-0.5at % Nd-0.5at % Cu Alloy | 84.0 | 89.8 | ○ |
| 51 | Ag-0.2at % Bi-0.5at % Nd-0.5at % Au Alloy | 84.0 | 89.9 | ○ |
| 52 | Ag-0.2at % Bi-0.5at % Y-0.5at % Cu Alloy | 83.9 | 89.8 | ○ |
| 53 | Ag-0.2at % Bi-0.5at % Y-0.5at % Au Alloy | 83.9 | 89.8 | ○ |
| 54 | Ag-0.2at % Sb-0.5at % Nd-0.5at % Cu Alloy | 83.9 | 89.7 | ○ |
| 55 | Ag-0.2at % Sb-0.5at % Nd-0.5at % Au Alloy | 83.9 | 89.8 | ○ |
| 56 | Ag-0.2at % Sb-0.5at % Y-0.5at % Cu Alloy | 83.8 | 89.7 | ○ |
| 57 | Ag-0.2at % Sb-0.5at % Y-0.5at % Au Alloy | 83.8 | 89.7 | ○ |
| 58 | Ag-0.2at % Si Alloy | 85.5 | 90.3 | ○ |
| 59 | Ag-0.2at % Sn Alloy | 85.0 | 89.9 | ○ |

TABLE 5

Results of durability (thermal stability) evaluation

| | | Change in reflectance before and after high temperature high humidity test [%] | | |
|---|---|---|---|---|
| Sample No. | Composition | Wavelength 405 nm | Wavelength 650 nm | High durability |
| 1 | Pure Ag | −27.3 | −3.0 | x |
| 2 | Ag-0.005at % Bi Alloy | −1.4 | −0.8 | ○ |
| 3 | Ag-0.2at % Bi Alloy | −0.7 | −0.3 | ○ |
| 4 | Ag-0.4at % Bi Alloy | −0.5 | −0.2 | ○ |
| 5 | Ag-0.6at % Bi Alloy | −0.3 | −0.1 | ○ |
| 6 | Ag-0.005at % Sb Alloy | −1.6 | −0.9 | ○ |
| 7 | Ag-0.2at % Sb Alloy | −0.8 | −0.4 | ○ |
| 8 | Ag-0.4at % Sb Alloy | −0.6 | −0.3 | ○ |
| 9 | Ag-0.6at % Sb Alloy | −0.4 | −0.2 | ○ |
| 10 | Ag-0.2at % Bi-0.01at % Nd Alloy | −0.6 | −0.2 | ○ |
| 11 | Ag-0.2at % Bi-0.1at % Nd Alloy | −0.5 | −0.1 | ○ |
| 12 | Ag-0.2at % Bi-0.5at % Nd Alloy | −0.3 | −0.1 | ○ |
| 13 | Ag-0.2at % Bi-2at % Nd Alloy | 0.0 | 0.0 | ○ |
| 14 | Ag-0.2at % Bi-3at % Nd Alloy | 0.0 | 0.0 | ○ |
| 15 | Ag-0.2at % Bi-0.01at % Y Alloy | −0.6 | −0.2 | ○ |
| 16 | Ag-0.2at % Bi-0.1at % Y Alloy | −0.5 | −0.1 | ○ |
| 17 | Ag-0.2at % Bi-0.5at % Y Alloy | −0.4 | −0.1 | ○ |
| 18 | Ag-0.2at % Bi-2at % Y Alloy | 0.0 | 0.0 | ○ |
| 19 | Ag-0.2at % Bi-3at % Y Alloy | 0.0 | 0.0 | ○ |
| 20 | Ag-0.2at % Sb-0.01at % Nd Alloy | −0.7 | −0.3 | ○ |
| 21 | Ag-0.2at % Sb-0.1at % Nd Alloy | −0.6 | −0.2 | ○ |
| 22 | Ag-0.2at % Sb-0.5at % Nd Alloy | −0.4 | −0.2 | ○ |
| 23 | Ag-0.2at % Sb-2at % Nd Alloy | 0.0 | 0.0 | ○ |
| 24 | Ag-0.2at % Sb-3at % Nd Alloy | 0.0 | 0.0 | ○ |
| 25 | Ag-0.2at % Sb-0.01at % Y Alloy | −0.7 | −0.3 | ○ |
| 26 | Ag-0.2at % Sb-0.1at % Y Alloy | −0.6 | −0.2 | ○ |
| 27 | Ag-0.2at % Sb-0.5at % Y Alloy | −0.5 | −0.2 | ○ |
| 28 | Ag-0.2at % Sb-2at % Y Alloy | 0.0 | 0.0 | ○ |
| 29 | Ag-0.2at % Sb-3at % Y Alloy | 0.0 | 0.0 | ○ |

TABLE 6

Results of durability (thermal stability) evaluation

| | | Change in reflectance before and after high temperature high humidity test [%] | | |
|---|---|---|---|---|
| Sample No. | Composition | Wavelength 405 nm | Wavelength 650 nm | High durability |
| 1 | Pure Ag | −27.3 | −3.0 | x |
| 30 | Ag-0.2at % Bi-0.01at % Cu Alloy | −0.6 | −0.2 | ○ |
| 31 | Ag-0.2at % Bi-0.1at % Cu Alloy | −0.5 | −0.1 | ○ |
| 32 | Ag-0.2at % Bi-0.5at % Cu Alloy | −0.4 | −0.1 | ○ |
| 33 | Ag-0.2at % Bi-3at % Cu Alloy | 0.0 | 0.0 | ○ |
| 34 | Ag-0.2at % Bi-4at % Cu Alloy | 0.0 | 0.0 | ○ |
| 35 | Ag-0.2at % Bi-0.01at % Au Alloy | −0.6 | −0.2 | ○ |
| 36 | Ag-0.2at % Bi-0.1at % Au Alloy | −0.5 | −0.1 | ○ |
| 37 | Ag-0.2at % Bi-0.5at % Au Alloy | −0.4 | −0.1 | ○ |
| 38 | Ag-0.2at % Bi-3at % Au Alloy | 0.0 | 0.0 | ○ |
| 39 | Ag-0.2at % Bi-4at % Au Alloy | 0.0 | 0.0 | ○ |
| 40 | Ag-0.2at % Sb-0.01at % Cu Alloy | −0.7 | −0.3 | ○ |
| 41 | Ag-0.2at % Sb-0.1at % Cu Alloy | −0.6 | −0.2 | ○ |
| 42 | Ag-0.2at % Sb-0.5at % Cu Alloy | −0.4 | −0.1 | ○ |
| 43 | Ag-0.2at % Sb-2at % Cu Alloy | 0.0 | 0.0 | ○ |
| 44 | Ag-0.2at % Sb-4at % Cu Alloy | 0.0 | 0.0 | ○ |
| 45 | Ag-0.2at % Sb-0.01at % Au Alloy | −0.7 | −0.3 | ○ |
| 46 | Ag-0.2at % Sb-0.1at % Au Alloy | −0.5 | −0.2 | ○ |
| 47 | Ag-0.2at % Sb-0.5at % Au Alloy | −0.3 | −0.1 | ○ |
| 48 | Ag-0.2at % Sb-3at % Au Alloy | 0.0 | 0.0 | ○ |
| 49 | Ag-0.2at % Sb-4at % Au Alloy | 0.0 | 0.0 | ○ |
| 50 | Ag-0.2at % Bi-0.5at % Nd-0.5at % Cu Alloy | 0.0 | 0.0 | ○ |
| 51 | Ag-0.2at % Bi-0.5at % Nd-0.5at % Au Alloy | 0.0 | 0.0 | ○ |
| 52 | Ag-0.2at % Bi-0.5at % Y-0.5at % Cu Alloy | 0.0 | 0.0 | ○ |

TABLE 6-continued

Results of durability (thermal stability) evaluation

| | | Change in reflectance before and after high temperature high humidity test [%] | | |
|---|---|---|---|---|
| Sample No. | Composition | Wavelength 405 nm | Wavelength 650 nm | High durability |
| 53 | Ag-0.2at % Bi-0.5at % Y-0.5at % Au Alloy | 0.0 | 0.0 | ○ |
| 54 | Ag-0.2at % Sb-0.5at % Nd-0.5at % Cu Alloy | 0.0 | 0.0 | ○ |
| 55 | Ag-0.2at % Sb-0.5at % Nd-0.5at % Au Alloy | 0.0 | 0.0 | ○ |
| 56 | Ag-0.2at % Sb-0.5at % Y-0.5at % Cu Alloy | 0.0 | 0.0 | ○ |
| 57 | Ag-0.2at % Sb-0.5at % Y-0.5at % Au Alloy | 0.0 | 0.0 | ○ |
| 58 | Ag-0.2at % Si Alloy | −19.9 | −2.1 | x |
| 59 | Ag-0.2at % Sn Alloy | −18.4 | −1.8 | x |

TABLE 7

Change in appearance after salt immersion test of Ag-based thin film

| Sample No. | Composition | Change in appearance after salt immersion test | High durability |
|---|---|---|---|
| 1 | Pure Ag | Yes | x |
| 2 | Ag-0.005at % Bi Alloy | No | ○ |
| 3 | Ag-0.2at % Bi Alloy | No | ○ |
| 4 | Ag-0.4at % Bi Alloy | No | ○ |
| 5 | Ag-0.6at % Bi Alloy | No | ○ |
| 6 | Ag-0.005at % Sb Alloy | No | ○ |
| 7 | Ag-0.2at % Sb Alloy | No | ○ |
| 8 | Ag-0.4at % Sb Alloy | No | ○ |
| 9 | Ag-0.6at % Sb Alloy | No | ○ |
| 10 | Ag-0.2at % Bi-0.01at % Nd Alloy | No | ○ |
| 11 | Ag-0.2at % Bi-0.1at % Nd Alloy | No | ○ |
| 12 | Ag-0.2at % Bi-0.5at % Nd Alloy | No | ○ |
| 13 | Ag-0.2at % Bi-2at % Nd Alloy | No | ○ |
| 14 | Ag-0.2at % Bi-3at % Nd Alloy | No | ○ |
| 15 | Ag-0.2at % Bi-0.01at % Y Alloy | No | ○ |
| 16 | Ag-0.2at % Bi-0.1at % Y Alloy | No | ○ |
| 17 | Ag-0.2at % Bi-0.5at % Y Alloy | No | ○ |
| 18 | Ag-0.2at % Bi-2at % Y Alloy | No | ○ |
| 19 | Ag-0.2at % Bi-3at % Y Alloy | No | ○ |
| 20 | Ag-0.2at % Sb-0.01at % Nd Alloy | No | ○ |
| 21 | Ag-0.2at % Sb-0.1at % Nd Alloy | No | ○ |
| 22 | Ag-0.2at % Sb-0.5at % Nd Alloy | No | ○ |
| 23 | Ag-0.2at % Sb-2at % Nd Alloy | No | ○ |
| 24 | Ag-0.2at % Sb-3at % Nd Alloy | No | ○ |
| 25 | Ag-0.2at % Sb-0.01at % Y Alloy | No | ○ |
| 26 | Ag-0.2at % Sb-0.1at % Y Alloy | No | ○ |
| 27 | Ag-0.2at % Sb-0.5at % Y Alloy | No | ○ |
| 28 | Ag-0.2at % Sb-2at % Y Alloy | No | ○ |
| 29 | Ag-0.2at % Sb-3at % Y Alloy | No | ○ |

TABLE 8

Change in appearance after salt immersion test of Ag-based thin film

| Sample No. | Composition | Change in appearance after salt immersion test | High durability |
|---|---|---|---|
| 1 | Pure Ag | Yes | x |
| 30 | Ag-0.2at % Bi-0.01at % Cu Alloy | No | ○ |
| 31 | Ag-0.2at % Bi-0.1at % Cu Alloy | No | ○ |
| 32 | Ag-0.2at % Bi-0.5at % Cu Alloy | No | ○ |
| 33 | Ag-0.2at % Bi-3at % Cu Alloy | No | ○ |
| 34 | Ag-0.2at % Bi-4at % Cu Alloy | No | ○ |
| 35 | Ag-0.2at % Bi-0.01at % Au Alloy | No | ○ |
| 36 | Ag-0.2at % Bi-0.1at % Au Alloy | No | ○ |
| 37 | Ag-0.2at % Bi-0.5at % Au Alloy | No | ○ |
| 38 | Ag-0.2at % Bi-3at % Au Alloy | No | ○ |
| 39 | Ag-0.2at % Bi-4at % Au Alloy | No | ○ |
| 40 | Ag-0.2at % Sb-0.01at % Cu Alloy | No | ○ |

TABLE 8-continued

Change in appearance after salt immersion test of Ag-based thin film

| Sample No. | Composition | Change in appearance after salt immersion test | High durability |
|---|---|---|---|
| 41 | Ag-0.2at % Sb-0.1at % Cu Alloy | No | ○ |
| 42 | Ag-0.2at % Sb-0.5at % Cu Alloy | No | ○ |
| 43 | Ag-0.2at % Sb-3at % Cu Alloy | No | ○ |
| 44 | Ag-0.2at % Sb-4at % Cu Alloy | No | ○ |
| 45 | Ag-0.2at % Sb-0.01at % Au Alloy | No | ○ |
| 46 | Ag-0.2at % Sb-0.1at % Au Alloy | No | ○ |
| 47 | Ag-0.2at % Sb-0.5at % Au Alloy | No | ○ |
| 48 | Ag-0.2at % Sb-3at % Au Alloy | No | ○ |
| 49 | Ag-0.2at % Sb-4at % Au Alloy | No | ○ |
| 50 | Ag-0.2at % Bi-0.5at % Nd-0.5at % Cu Alloy | No | ○ |
| 51 | Ag-0.2at % Bi-0.5at % Nd-0.5at % Au Alloy | No | ○ |
| 52 | Ag-0.2at % Bi-0.5at % Y-0.5at % Cu Alloy | No | ○ |
| 53 | Ag-0.2at % Bi-0.5at % Y-0.5at % Au Alloy | No | ○ |
| 54 | Ag-0.2at % Sb-0.5at % Nd-0.5at % Cu Alloy | No | ○ |
| 55 | Ag-0.2at % Sb-0.5at % Nd-0.5at % Au Alloy | No | ○ |
| 56 | Ag-0.2at % Sb-0.5at % Y-0.5at % Cu Alloy | No | ○ |
| 57 | Ag-0.2at % Sb-0.5at % Y-0.5at % Au Alloy | No | ○ |
| 58 | Ag-0.2at % Si Alloy | Yes | x |
| 59 | Ag-0.2at % Sn Alloy | Yes | x |

TABLE 9

Average roughness before and after high temperature high humidity test of Ag-based thin film

| Sample No. | Composition | Average roughness before and after high temperature high humidity test [nm] | | High durability |
|---|---|---|---|---|
| | | Before test | After test | |
| 1 | Pure Ag | 4.18 | 7.33 | x |
| 2 | Ag-0.005at % Bi Alloy | 0.63 | 0.93 | ○ |
| 3 | Ag-0.2at % Bi Alloy | 0.58 | 0.61 | ○ |
| 4 | Ag-0.4at % Bi Alloy | 0.55 | 0.58 | ○ |
| 5 | Ag-0.6at % Bi Alloy | 0.52 | 0.54 | ○ |
| 6 | Ag-0.005at % Sb Alloy | 0.65 | 0.95 | ○ |
| 7 | Ag-0.2at % Sb Alloy | 0.58 | 0.63 | ○ |
| 8 | Ag-0.4at % Sb Alloy | 0.56 | 0.59 | ○ |
| 9 | Ag-0.6at % Sb Alloy | 0.54 | 0.57 | ○ |
| 10 | Ag-0.2at % Bi-0.01at % Nd Alloy | 0.58 | 0.60 | ○ |
| 11 | Ag-0.2at % Bi-0.1at % Nd Alloy | 0.55 | 0.59 | ○ |
| 12 | Ag-0.2at % Bi-0.5at % Nd Alloy | 0.52 | 0.56 | ○ |
| 13 | Ag-0.2at % Bi-2at % Nd Alloy | 0.45 | 0.48 | ○ |
| 14 | Ag-0.2at % Bi-3at % Nd Alloy | 0.44 | 0.48 | ○ |
| 15 | Ag-0.2at % Bi-0.01at % Y Alloy | 0.57 | 0.60 | ○ |
| 16 | Ag-0.2at % Bi-0.1at % Y Alloy | 0.56 | 0.59 | ○ |
| 17 | Ag-0.2at % Bi-0.5at % Y Alloy | 0.53 | 0.58 | ○ |
| 18 | Ag-0.2at % Bi-2at % Y Alloy | 0.47 | 0.53 | ○ |
| 19 | Ag-0.2at % Bi-3at % Y Alloy | 0.45 | 0.52 | ○ |
| 20 | Ag-0.2at % Sb-0.01at % Nd Alloy | 0.58 | 0.62 | ○ |
| 21 | Ag-0.2at % Sb-0.1at % Nd Alloy | 0.56 | 0.60 | ○ |
| 22 | Ag-0.2at % Sb-0.5at % Nd Alloy | 0.53 | 0.58 | ○ |
| 23 | Ag-0.2at % Sb-2at % Nd Alloy | 0.47 | 0.50 | ○ |
| 24 | Ag-0.2at % Sb-3at % Nd Alloy | 0.47 | 0.49 | ○ |
| 25 | Ag-0.2at % Sb-0.01at % Y Alloy | 0.58 | 0.63 | ○ |
| 26 | Ag-0.2at % Sb-0.1at % Y Alloy | 0.55 | 0.61 | ○ |
| 27 | Ag-0.2at % Sb-0.5at % Y Alloy | 0.54 | 0.60 | ○ |
| 28 | Ag-0.2at % Sb-2at % Y Alloy | 0.46 | 0.54 | ○ |
| 29 | Ag-0.2at % Sb-3at % Y Alloy | 0.45 | 0.53 | ○ |

TABLE 10

Average roughness before and after high temperature high humidity test of Ag-based thin film

| Sample No. | Composition | Average roughness before and after high temperature high humidity test [nm] | | High durability |
|---|---|---|---|---|
| | | Before test | After test | |
| 1 | Pure Ag | 4.18 | 7.33 | x |
| 30 | Ag-0.2at % Bi-0.01at % Cu Alloy | 0.59 | 0.93 | ○ |
| 31 | Ag-0.2at % Bi-0.1at % Cu Alloy | 0.58 | 0.90 | ○ |
| 32 | Ag-0.2at % Bi-0.5at % Cu Alloy | 0.56 | 0.86 | ○ |
| 33 | Ag-0.2at % Bi-3at % Cu Alloy | 0.55 | 0.75 | ○ |
| 34 | Ag-0.2at % Bi-4at % Cu Alloy | 0.54 | 0.73 | ○ |
| 35 | Ag-0.2at % Bi-0.01at % Au Alloy | 0.59 | 0.94 | ○ |
| 36 | Ag-0.2at % Bi-0.1at % Au Alloy | 0.57 | 0.89 | ○ |
| 37 | Ag-0.2at % Bi-0.5at % Au Alloy | 0.56 | 0.84 | ○ |
| 38 | Ag-0.2at % Bi-3at % Au Alloy | 0.54 | 0.76 | ○ |
| 39 | Ag-0.2at % Bi-4at % Au Alloy | 0.53 | 0.75 | ○ |
| 40 | Ag-0.2at % Sb-0.01at % Cu Alloy | 0.59 | 0.95 | ○ |
| 41 | Ag-0.2at % Sb-0.1at % Cu Alloy | 0.58 | 0.91 | ○ |
| 42 | Ag-0.2at % Sb-0.5at % Cu Alloy | 0.57 | 0.88 | ○ |
| 43 | Ag-0.2at % Sb-3at % Cu Alloy | 0.56 | 0.78 | ○ |
| 44 | Ag-0.2at % Sb-4at % Cu Alloy | 0.54 | 0.77 | ○ |
| 45 | Ag-0.2at % Sb-0.01at % Au Alloy | 0.58 | 0.94 | ○ |
| 46 | Ag-0.2at % Sb-0.1at % Au Alloy | 0.58 | 0.90 | ○ |
| 47 | Ag-0.2at % Sb-0.5at % Au Alloy | 0.57 | 0.86 | ○ |
| 48 | Ag-0.2at % Sb-3at % Au Alloy | 0.57 | 0.79 | ○ |
| 49 | Ag-0.2at % Sb-4at % Au Alloy | 0.55 | 0.77 | ○ |
| 50 | Ag-0.2at % Bi-0.5at % Nd-0.5at % Cu Alloy | 0.50 | 0.55 | ○ |
| 51 | Ag-0.2at % Bi-0.5at % Nd-0.5at % Au Alloy | 0.51 | 0.56 | ○ |
| 52 | Ag-0.2at % Bi-0.5at % Y-0.5at % Cu Alloy | 0.52 | 0.57 | ○ |
| 53 | Ag-0.2at % Bi-0.5at % Y-0.5at % Au Alloy | 0.51 | 0.55 | ○ |
| 54 | Ag-0.2at % Sb-0.5at % Nd-0.5at % Cu Alloy | 0.52 | 0.58 | ○ |
| 55 | Ag-0.2at % Sb-0.5at % Nd-0.5at % Au Alloy | 0.53 | 0.60 | ○ |
| 56 | Ag-0.2at % Sb-0.5at % Y-0.5at % Cu Alloy | 0.52 | 0.59 | ○ |
| 57 | Ag-0.2at % Sb-0.5at % Y-0.5at % Au Alloy | 0.54 | 0.59 | ○ |
| 58 | Ag-0.2at % Si Alloy | 0.68 | 1.17 | x |
| 59 | Ag-0.2at % Sn Alloy | 0.79 | 1.25 | x |

TABLE 11

| | Test No. | Composition | Amount of element added (at %) | High temperature high humidity test (Ag aggregation test) | Evaluation results | | | Salt immersion test | |
|---|---|---|---|---|---|---|---|---|---|
| | | | | | Sheet resistance (Ω/□) | | Visible light transmittance (%) | Discoloration (turning yellow) | Peeling |
| | | | | | Before Ag aggregation test | After Ag aggregation test | | | |
| Comparative Example 1 | 1 | Pure Ag | — | X | 12 | 48 | 80 | X | Observed |
| Example 1 | 2 | Ag—Bi | 0.01 | Δ | 12 | 23 | 80 | Δ | None |
| | 3 | | 0.04 | ○ | 13 | 16 | 79 | ○ | None |
| | 4 | | 0.12 | ○ | 16 | 16 | 79 | ○ | None |
| | 5 | | 0.19 | ○ | 18 | 17 | 78 | ○ | None |
| | 6 | | 1.2 | ○ | 20 | 20 | 76 | ○ | None |
| | 7 | | 5.1 | ○ | 29 | 30 | 72 | ○ | None |
| | 8 | | 10.0 | ○ | 41 | 41 | 43 | ○ | None |
| | 9 | Ag—Sb | 0.009 | Δ | 12 | 25 | 80 | Δ | None |
| | 10 | | 0.05 | ○ | 12 | 14 | 78 | ○ | None |
| | 11 | | 0.11 | ○ | 13 | 13 | 77 | ○ | None |
| | 12 | | 0.22 | ○ | 18 | 17 | 76 | ○ | None |
| | 13 | | 1.1 | ○ | 23 | 21 | 73 | ○ | None |
| | 14 | | 4.9 | ○ | 31 | 33 | 70 | ○ | None |
| | 15 | | 10.0 | ○ | 43 | 45 | 45 | ○ | None |

TABLE 12

| | Test No. | Composition | Amount of element added (at %) | High temperature high humidity test (Ag aggregation test) | Sheet resistance (Ω/□) Before Ag aggregation test | Sheet resistance (Ω/□) After Ag aggregation test | Visible light transmittance (%) | Salt immersion test Discoloration (turning yellow) | Peeling |
|---|---|---|---|---|---|---|---|---|---|
| Comparative Example 1 | 16 | Ag—Nd | 1.0 | ○ | 13 | 14 | 77 | X | Observed |
| | 17 | Ag—In | 0.40 | X | 14 | 35 | 76 | Δ | None |
| | 18 | Ag—Nb | 0.92 | X | 16 | 38 | 75 | Δ | Observed |
| | 19 | Ag—Sn | 0.88 | X | 16 | 42 | 76 | X | Observed |
| | 20 | Ag—Cu | 1.0 | X | 13 | 36 | 75 | X | None |
| | 21 | Ag—Al | 0.9 | X | 16 | 47 | 63 | X | Observed |
| | 22 | Ag—Zn | 1.0 | X | 20 | 46 | 67 | X | Observed |

TABLE 13

| | Test No. | Composition | Amount of element added (at %) Bi/Sb | Amount of element added (at %) Others | High temperature high humidity test Number of white spots generated | Sheet resistance (Ω/□) Before Ag aggregation test | Sheet resistance (Ω/□) After Ag aggregation test | Visible light transmittance (%) |
|---|---|---|---|---|---|---|---|---|
| Comparative Example 2 | 23 | Ag | — | — | 98 | 5 | 43 | 79 |
| Example 2 | 24 | Ag—Bi | 0.19 | — | 10 | 16 | 15 | 77 |
| | 25 | Ag—Bi—Au | 0.19 | 0.3 | 8 | 16 | 16 | 77 |
| | 26 | | 0.19 | 0.9 | 5 | 16 | 17 | 76 |
| | 27 | Ag—Bi—Cu | 0.19 | 0.4 | 10 | 17 | 20 | 75 |
| | 28 | | 0.19 | 1.1 | 4 | 17 | 19 | 73 |
| | 29 | Ag—Bi—Pb | 0.19 | 0.3 | 8 | 16 | 15 | 76 |
| | 30 | | 0.19 | 1.5 | 4 | 19 | 19 | 72 |
| | 31 | Ag—Sb—Au | 0.21 | 3.0 | 0 | 17 | 16 | 68 |
| | 32 | | 0.21 | 10.0 | 0 | 26 | 26 | 53 |
| | 33 | Ag—Sb—Cu | 0.21 | 2.7 | 0 | 19 | 17 | 65 |
| | 34 | | 0.21 | 9.7 | 0 | 28 | 30 | 48 |

TABLE 14

| | Test No. | Composition | Amount of element added (at %) | Reflectance (%): Wavelength 400 nm Initial reflectance before environmental test [A] | Reflectance (%): Wavelength 400 nm After environmental test [B] | Amount of change [B − A] | Surface roughness (nm) Before environmental test [C] | Surface roughness (nm) After environmental test [D] | Amount of change [D − C] | Electric resistance (μΩcm) | Salt immersion test Discoloration (turning yellow) | Peeling |
|---|---|---|---|---|---|---|---|---|---|---|---|---|
| Example 1 | 1 | Pure Ag | — | 90.8 | 63.5 | −27.3 | 4.2 | 7.3 | 3.1 | 2.3 | X | Observed |
| | 2 | Ag—Bi | 0.01 | 89.4 | 83.0 | −5.4 | 2.1 | 2.8 | 0.7 | 2.5 | Δ | None |
| | 3 | | 0.04 | 88.2 | 87.2 | −1.0 | 0.92 | 1.01 | 0.09 | 2.6 | ○ | None |
| | 4 | | 0.19 | 86.2 | 85.4 | −0.8 | 0.65 | 0.71 | 0.06 | 3.3 | ○ | None |
| | 5 | | 0.9 | 81.2 | 81.4 | +0.2 | 0.64 | 0.65 | 0.01 | 7.0 | ○ | None |
| | 6 | | 2.0 | 74.3 | 73.8 | −0.5 | 0.63 | 0.62 | −0.01 | 14.8 | ○ | None |
| | 7 | | 3.1 | 62.3 | 62.4 | +0.1 | 0.64 | 0.66 | 0.02 | 20.6 | ○ | None |
| | 8 | Ag—Sb | 0.009 | 89.4 | 83.0 | −5.4 | 2.1 | 2.8 | 0.7 | 2.4 | Δ | None |
| | 9 | | 0.05 | 88.2 | 87.2 | −1.0 | 0.92 | 1.01 | 0.09 | 2.5 | ○ | None |
| | 10 | | 0.21 | 86.2 | 85.4 | −0.8 | 0.65 | 0.71 | 0.06 | 3.2 | ○ | None |
| | 11 | | 1.8 | 74.3 | 73.8 | −0.5 | 0.63 | 0.62 | −0.01 | 13.6 | ○ | None |
| | 12 | | 3.0 | 62.3 | 62.4 | +0.1 | 0.64 | 0.66 | 0.02 | 19.5 | ○ | None |

TABLE 14-continued

| | Test No. | Composition | Amount of element added (at %) | Initial reflectance before environmental test [A] | After environmental test [B] | Amount of change [B – A] | Surface roughness (nm) Before environmental test [C] | After environmental test [D] | Amount of change [D – C] | Electric resistance (μΩcm) | Salt immersion test Discoloration (turning yellow) | Peeling |
|---|---|---|---|---|---|---|---|---|---|---|---|---|
| Comparative Example 1 | 13 | Ag—Nd | 0.4 | 86.9 | 85.0 | −1.9 | 0.52 | 0.61 | 0.09 | 4.9 | X | Observed |
| | 14 | Ag—In | 0.40 | 87.8 | 83.3 | −4.5 | 3.6 | 7.1 | 3.5 | 4.5 | Δ | None |
| | 15 | Ag—Nb | 0.92 | 83.8 | 81.3 | −2.5 | 2.1 | 3.1 | 1.0 | 9.5 | Δ | Observed |
| | 16 | Ag—Sn | 0.88 | 85.7 | 79.0 | −6.7 | 3.5 | 6.2 | 2.7 | 6.4 | X | Observed |

NOTE:
Discoloration (turning yellow):
○: No discoloration,
Δ: Slight discoloration,
X: Large discoloration

TABLE 15

| | Test No. | Composition | Amount of element added (at %) Bi, Sb | Others | Initial reflectance before environmental test [A] | After environmental test [B] | Amount of change [B – A] | Surface roughness (nm) Before environmental test [C] | After environmental test [D] | Amount of change [D – C] | Electric resistance (μΩcm) |
|---|---|---|---|---|---|---|---|---|---|---|---|
| Comparative Example 2 | 1 | Pure Ag | — | — | 90.8 | 63.5 | −27.3 | 4.2 | 7.3 | 3.1 | 2.3 |
| | 4 | Ag—Bi | 0.19 | — | 86.2 | 85.4 | −0.8 | 0.65 | 0.71 | 0.06 | 3.3 |
| | 17 | Ag—Bi—Nd | 0.19 | 0.7 | 85.1 | 84.7 | −0.4 | 0.48 | 0.49 | 0.01 | Not measured |
| | 18 | Ag—Bi—Y | 0.19 | 0.5 | 85.4 | 84.8 | −0.6 | 0.59 | 0.56 | −0.03 | Not measured |
| | 19 | Ag—Bi—Cu | 0.19 | 0.9 | 86.0 | 85.5 | −0.5 | 0.68 | 0.70 | 0.02 | 3.4 |
| | 20 | Ag—Bi—Au | 0.19 | 1.0 | 85.9 | 85.7 | −0.2 | 0.70 | 0.71 | 0.01 | 3.5 |
| | 21 | Ag—Bi—Cu | 0.19 | 3.0 | 87.5 | 87.2 | −0.3 | 0.63 | 0.72 | 0.09 | 4.1 |
| | 22 | Ag—Sb—Au | 0.20 | 1.0 | 86.1 | 86.0 | −0.1 | 0.65 | 0.68 | 0.03 | 3.2 |
| | 23 | Ag—Sb—Cu | 0.20 | 1.0 | 85.8 | 85.8 | 0.0 | 0.64 | 0.70 | 0.06 | 3.4 |
| | 24 | Ag—Sb—Cu | 0.20 | 3.0 | 85.1 | 85.1 | 0.0 | 0.59 | 0.62 | 0.03 | 3.8 |

TABLE 16

| Sample No. | Composition of sputtering target | Bi content of thin film |
|---|---|---|
| 1 | Ag-0.01at % Bi Alloy | <0.001 |
| 2 | Ag-0.04at % Bi Alloy | <0.001 |
| 3 | Ag-0.05at % Bi Alloy | 0.005 |
| 4 | Ag-0.20at % Bi Alloy | 0.011 |
| 5 | Ag-1.41at % Bi Alloy | 0.056 |
| 6 | Ag-4.50at % Bi Alloy | 0.398 |
| 7 | Ag-7.00at % Bi Alloy | 1.02 |
| 8 | Ag-14.3at % Bi Alloy | 3.82 |
| 9 | Ag-22.9at % Bi Alloy | 9.93 |
| 10 | Ag-40.8at % Bi Alloy | 27.2 |

What is claimed is:

1. A film-coated substrate, comprising:
a substrate and
a film on the substrate, wherein the film comprises a Ag base alloy, wherein the Ag base alloy comprises Ag, 0.005 to 10 at % of Bi and at least one rare earth metal element.

2. The film-coated substrate of claim 1, wherein the Ag base alloy comprises 0.01 to 2 at % of the rare earth metal element.

3. The film-coated substrate of claim 1, wherein the Ag base alloy comprises 0.1 to 2 at % of the rare earth metal element.

4. The film-coated substrate of claim 1, wherein the Ag base alloy comprises 0.01 to 1 at % of the rare earth metal element.

5. The film-coated substrate of claim 1, wherein the Ag base alloy comprises 0.1 to 1 at % of the rare earth metal element.

6. The film-coated substrate of claim 1, wherein the Ag base alloy comprises 0.01 to 0.6 at % of the rare earth metal element.

7. The film-coated substrate of claim 1, wherein the Ag base alloy comprises 0.1 to 0.6 at % of the rare earth metal element.

8. The film-coated substrate of claim 1, wherein the rare earth metal element is Nd.

9. The film-coated substrate of claim 1, wherein the rare earth metal element is Y.

10. The film-coated substrate of claim 1, wherein the rare earth metal element is Nd and Y.

11. The film-coated substrate of claim 1, wherein the Ag base alloy comprises 0.01 to 4 at % of Bi.

12. The film-coated substrate of claim 1, wherein the Ag base alloy comprises 0.005 to 0.4 at % of Bi.

13. The film-coated substrate of claim 1, wherein the substrate is transparent.

14. The film-coated substrate of claim 12, wherein the substrate is plastic.

15. The film-coated substrate of claim 1, wherein the Ag base alloy consists essentially of Ag, Bi and least one rare earth metal element.

16. The film-coated substrate of claim 12, wherein the film has a thickness of 3 to 300 nm.

17. The film-coated substrate of claim 12, wherein the film is reflective.

18. The film-coated substrate of claim 12, wherein the film is semi-reflective and has a transmittance of 60 to 72%.

19. An optical information recording medium, comprising:
a substrate,
a reflective film comprising a first Ag base alloy, wherein the first Ag base alloy comprises Ag and at least 0.005 at % of Bi, and
a semi-transmissive reflective film comprising a second Ag base alloy, wherein the second Ag base alloy comprises Ag, at least one rare earth metal element and at least 0.005 at % of Bi.

20. The optical information recording medium of claim 19, wherein the second Ag base alloy comprises 0.01 to 2 at % of the rare earth metal element.

21. The optical information recording medium of claim 19, wherein the second Ag base alloy comprises 0.1 to 2 at % of the rare earth metal element.

22. The optical information recording medium of claim 19, wherein the second Ag base alloy comprises 0.01 to 1 at % of the rare earth metal element.

23. The optical information recording medium of claim 19, wherein the second Ag base alloy comprises 0.1 to 1 at % of the rare earth metal element.

24. The optical information recording medium of claim 19, wherein the second Ag base alloy comprises 0.01 to 0.6 at % of the rare earth metal element.

25. The optical information recording medium of claim 19, wherein the second Ag base alloy comprises 0.1 to 0.6 at % of the rare earth metal element.

26. The optical information recording medium of claim 19, wherein the rare earth metal element is Nd.

27. The optical information recording medium of claim 19, wherein the rare earth metal element is Y.

28. The optical information recording medium of claim 19, wherein the rare earth metal element is Nd and Y.

29. The optical information recording medium of claim 19, wherein the first Ag base alloy comprises 0.005 to 0.40 at % of Bi.

30. The optical information recording medium of claim 29, wherein the second Ag base alloy comprises 0.005 to 0.40 at % of Bi.

31. The optical information recording medium of claim 19, wherein the second Ag base alloy comprises 0.005 to 0.40 at % of Bi.

32. The optical information recording medium of claim 29, wherein the substrate is transparent.

33. The optical information recording medium of claim 29, wherein the substrate is plastic.

34. The optical information recording medium of claim 19, wherein the reflective film has a thickness of 3 to 300 nm.

35. The optical information recording medium of claim 19, wherein the semi-transmissive reflective film has a thickness of 5 to 20 nm.

36. The optical information recording medium of claim 19, wherein the first Ag base alloy consist essentially of Ag and Bi.

37. The optical information recording medium of claim 19, wherein the second Ag base alloy consists essentially of Ag, Bi and least one rare earth metal element.

38. An optical information recording medium, comprising:
a substrate,
a reflective film comprising a first Ag bas&alloy, wherein the first Ag base alloy comprises Ag and at least 0.005 at % of Bi, and
a semi-transmissive reflective film having a transmittance of about 60 to 72% and comprising a second Ag base alloy, wherein the second Ag base alloy comprises Ag and at least 0.005 at % of Bi,
wherein at least one of the first Ag base alloy and the second Ag base alloy comprises at least one rare earth metal element.

39. The optical information recording medium of claim 38, wherein at least one of the first Ag base alloy and the second Ag base alloy comprises 0.01 to 2 at % of the rare earth metal element.

40. The optical information recording medium of claim 38, wherein at least one of the first Ag base alloy and the second Ag base alloy comprises 0.1 to 2 at % of the rare earth metal element.

41. The optical information recording medium of claim 38, wherein at least one of the first Ag base alloy and the second Ag base alloy comprises 0.01 to 1 at % of the rare earth metal element.

42. The optical information recording medium of claim 38, wherein at least one of the first Ag base alloy and the second Ag base alloy comprises 0.1 to 1 at % of the rare earth metal element.

43. The optical information recording medium of claim 38, wherein at least one of the first Ag base alloy and the second Ag base alloy comprises 0.01 to 0.6 at % of the rare earth metal element.

44. The optical information recording medium of claim 38, wherein at least one of the first Ag base alloy and the second Ag base alloy comprises 0.1 to 0.6 at % of the rare earth metal element.

45. The optical information recording medium of claim 38, wherein the rare earth metal element is Nd.

46. The optical information recording medium of claim 38, wherein the rare earth metal element is Y.

47. The optical information recording medium of claim 38, wherein the rare earth metal element is Nd and Y.

48. The optical information recording medium of claim 38, wherein the reflective film comprises at least one rare earth metal element.

49. The optical information recording medium of claim 38, wherein the semi-transmissive reflective film comprises at least one rare earth metal element.

50. The optical information recording medium of claim 38, wherein the first Ag base alloy comprises 0.005 to 0.40 at % of Bi.

51. The optical information recording medium of claim 50, wherein the second Ag base alloy comprises 0.005 to 0.40 at % of Bi.

52. The optical information recording medium of claim 38, wherein the second Ag base alloy comprises 0.005 to 0.40 at % of Bi.

53. The optical information recording medium of claim 38, wherein the substrate is transparent.

54. The optical information recording medium of claim 38, wherein the substrate is plastic.

55. The optical information recording medium of claim 38, wherein the reflective film has a thickness of 3 to 300 nm.

56. The optical information recording medium of claim 38, wherein the semi-transmissive reflective film has a thickness of 5 to 20 nm.

57. The optical information recording medium of claim 38, wherein at least one of the first Ag base alloy and the second Ag base alloy consists essentially of Ag and Bi.

58. The optical information recording medium of claim 38, wherein at least one of the first Ag base alloy and the second Ag base alloy consists essentially of Ag, Bi and at least one rare earth metal element.

59. The film-coated substrate of claim 1, wherein the Ag base alloy comprises 0.1 to 3 at % in total amount of at least one element selected from the group consisting of Cu, Au, Rh, Pd, and Pt.

60. The optical information recording medium of claim 19, wherein at least one of the first Ag base alloy and the second Ag base alloy comprises 0.1 to 3 at % in total amount of at least one element selected from the group consisting of Cu, Au, Rh, Pd, and Pt.

61. The optical information recording medium of claim 38, wherein at least one of the first Ag base alloy and the second Ag base alloy comprises 0.1 to 3 at % in total amount of at least one element selected from the group consisting of Cu, Au, Rh, Pd, and Pt.

* * * * *

UNITED STATES PATENT AND TRADEMARK OFFICE
CERTIFICATE OF CORRECTION

PATENT NO. : 7,419,711 B2  Page 1 of 1
APPLICATION NO. : 11/313815
DATED : September 2, 2008
INVENTOR(S) : Tauchi et al.

It is certified that error appears in the above-identified patent and that said Letters Patent is hereby corrected as shown below:

On the title page, Item (73), the Assignee information is incorrect. Item (73) should read:

-- (73) Assignee: Kabushiki Kaisha Kobe Seiko Sho (Kobe Steel, Ltd.), Kobe-shi (JP) --

Signed and Sealed this

Sixteenth Day of December, 2008

JON W. DUDAS
*Director of the United States Patent and Trademark Office*